(12) United States Patent
Ho et al.

(10) Patent No.: US 11,538,899 B2
(45) Date of Patent: Dec. 27, 2022

(54) SEMICONDUCTOR DEVICE AND MANUFACTURING METHOD THEREOF

(71) Applicant: Powerchip Semiconductor Manufacturing Corporation, Hsinchu (TW)

(72) Inventors: Ching-Sung Ho, Hsinchu (TW); Jia-Horng Tsai, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/308,072

(22) Filed: May 5, 2021

(65) Prior Publication Data

US 2022/0310780 A1 Sep. 29, 2022

(30) Foreign Application Priority Data

Mar. 26, 2021 (TW) .................................. 110111199

(51) Int. Cl.
*H01L 21/20* (2006.01)
*H01L 27/108* (2006.01)
*H01L 49/02* (2006.01)

(52) U.S. Cl.
CPC ........ *H01L 28/84* (2013.01); *H01L 27/10814* (2013.01); *H01L 27/10852* (2013.01)

(58) Field of Classification Search
CPC .............. H01L 27/10814; H01L 27/10852
USPC ............................ 257/308–309; 438/396–399
See application file for complete search history.

(56) References Cited

U.S. PATENT DOCUMENTS

| | | | |
|---|---|---|---|
| 7,851,843 B2 | 12/2010 | Lee et al. | |
| 8,860,115 B2* | 10/2014 | Jun | H01G 4/228 257/307 |
| 11,114,481 B2* | 9/2021 | Tomekawa | H01L 27/14609 |
| 11,164,937 B2* | 11/2021 | Ho | H01L 21/022 |
| 2003/0134436 A1* | 7/2003 | Yates | H01L 27/10852 438/1 |
| 2009/0101968 A1 | 4/2009 | Sugioka | |
| 2011/0124176 A1* | 5/2011 | Lim | H01L 28/90 438/396 |
| 2018/0182760 A1* | 6/2018 | Lin | H01L 21/02178 |

FOREIGN PATENT DOCUMENTS

| | | |
|---|---|---|
| TW | I679662 | 12/2019 |
| TW | I691092 | 4/2020 |

OTHER PUBLICATIONS

"Notice of allowance of Taiwan Counterpart Application", dated Aug. 24, 2022, p. 1-p. 5.

* cited by examiner

*Primary Examiner* — Calvin Lee
(74) *Attorney, Agent, or Firm* — JCIPRNET

(57) ABSTRACT

A semiconductor device including a substrate and a capacitor is provided. The capacitor includes a first electrode, a second electrode, and an insulating layer. The first electrode is located on the substrate. The first electrode has a plurality of hemispherical recesses. The second electrode is located on the first electrode. The insulating layer is located between the first electrode and the second electrode. Surfaces of the hemispherical recesses are in direct contact with the insulating layer.

8 Claims, 25 Drawing Sheets

SEMICONDUCTOR DEVICE AND MANUFACTURING METHOD THEREOF

CROSS-REFERENCE TO RELATED APPLICATION

This application claims the priority benefits of Taiwan application serial no. 110111199, filed on Mar. 26, 2021. The entirety of the above-mentioned patent application is hereby incorporated by reference herein and made a part of this specification.

BACKGROUND

Technical Field

The disclosure relates to a semiconductor device and a manufacturing method thereof, and particularly relates to a semiconductor device with a capacitor and a manufacturing method thereof.

Description of Related Art

In today's semiconductor industry, capacitors are important, basic components. For example, a basic structure design of a common capacitor is to insert an insulating material between two electrode plates, so that the two adjacent electrode plates and the in-between insulating material form a capacitor unit. And it is a current goal to increase the capacitance value of the capacitor effectively.

SUMMARY

The disclosure is directed to a semiconductor device and a manufacturing method thereof, which is adapted to effectively improve a capacitance value of a capacitor.

The disclosure provides a semiconductor device including a substrate and a capacitor. The capacitor includes a first electrode, a second electrode, and an insulating layer. The first electrode is located on the substrate. The first electrode has a plurality of hemispherical recesses. The second electrode is located on the first electrode. The insulating layer is located between the first electrode and the second electrode. Surfaces of the hemispherical recesses are in direct contact with the insulating layer.

In an embodiment of the disclosure, in the aforementioned semiconductor device, a shape of the first electrode is, for example, a cylindrical shape.

In an embodiment of the disclosure, in the aforementioned semiconductor device, a material of the first electrode is, for example, a metal compound or metal.

In an embodiment of the disclosure, the aforementioned semiconductor device further includes a plurality of capacitors. Moreover, the semiconductor device further includes a support structure. The support structure is connected between adjacent two of the first electrodes of adjacent two of the capacitors.

In an embodiment of the disclosure, in the aforementioned semiconductor device, the support structure includes a first support layer and a second support layer. The first support layer is connected between adjacent two of the first electrodes of adjacent two of the capacitors. The second support layer is connected between adjacent two of the first electrodes of adjacent two of the capacitors. The first support layer may be located between the second support layer and the substrate.

In an embodiment of the disclosure, in the aforementioned semiconductor device, the first electrode located between the first support layer and the second support layer has a plurality of the hemispherical recesses.

In an embodiment of the disclosure, in the aforementioned semiconductor device, the first electrode located between the first support layer and the second support layer has a plurality of the hemispherical recesses. The first electrode located between the substrate and the first support layer has a plurality of the hemispherical recesses.

The disclosure provides a method for manufacturing a semiconductor device, which includes the following steps. A substrate is provided. A capacitor is formed on the substrate. The capacitor includes a first electrode, a second electrode and an insulating layer. The first electrode is located on the substrate. The first electrode has a plurality of hemispherical recesses. The second electrode is located on the first electrode. The insulating layer is located between the first electrode and the second electrode. Surfaces of the hemispherical recesses are in direct contact with the insulating layer.

In an embodiment of the disclosure, in the aforementioned method for manufacturing the semiconductor device, a method of forming the first electrode includes following steps. A dielectric layer is formed on the substrate. A first opening is formed in the dielectric layer. A silicon spacer is formed on a sidewall of the dielectric layer exposed by the first opening. A thermal process is performed on the silicon spacer to form a plurality of hemispherical grains (HSG) on the silicon spacer. A first-electrode material layer is formed in the first opening. The first-electrode material layer covers the hemispherical grains. A part of the first-electrode material layer located above a top surface of the dielectric layer is removed to form the first electrode.

In an embodiment of the disclosure, in the aforementioned method for manufacturing the semiconductor device, a method of forming the insulating layer and the second electrode includes following steps. After the first electrode is formed, the dielectric layer, the silicon spacer and the hemispherical grains are removed to form a second opening. An insulating layer is formed on the first electrode. The second electrode is formed on the insulating layer. The second electrode fills the first opening and the second opening.

In an embodiment of the disclosure, in the aforementioned method for manufacturing the semiconductor device, a method of forming the first electrode includes following steps. A silicon material layer is formed on the substrate. A first opening is formed in the silicon material layer. A thermal process is performed on the silicon material layer, and a plurality of hemispherical grains are formed on a sidewall of the silicon material layer exposed by the first opening. A first-electrode material layer is formed in the first opening. The first-electrode material layer covers the hemispherical grains. A part of the first-electrode material layer located above a top surface of the silicon material layer is removed to form the first electrode.

In an embodiment of the disclosure, in the aforementioned method for manufacturing the semiconductor device, a method of forming the insulating layer and the second electrode includes following steps. After the first electrode is formed, the silicon material layer and the hemispherical grains are removed to form a second opening. An insulating layer is formed on the first electrode. The second electrode is formed on the insulating layer. The second electrode fills the first opening and the second opening.

In an embodiment of the disclosure, in the aforementioned method for manufacturing the semiconductor device, a plurality of capacitors are formed. In addition, the method for manufacturing the semiconductor device further includes following steps. A support structure connected between adjacent two of the first electrodes of adjacent two of the capacitors is formed.

In an embodiment of the disclosure, in the aforementioned method for manufacturing the semiconductor device, the support structure includes a first support layer and a second support layer. The first support layer is connected between adjacent two of the first electrodes of adjacent two of the capacitors. The second support layer is connected between adjacent two of the first electrodes of adjacent two of the capacitors. The first support layer is located between the second support layer and the substrate.

In an embodiment of the disclosure, in the aforementioned method for manufacturing the semiconductor device, the first electrode located between the first support layer and the second support layer has a plurality of the hemispherical recesses.

In an embodiment of the disclosure, in the aforementioned method for manufacturing the semiconductor device, the first electrode located between the first support layer and the second support layer has a plurality of the hemispherical recesses. The first electrode located between the substrate and the first support layer has a plurality of the hemispherical recesses.

Based on the above description, in the semiconductor device and the manufacturing method thereof proposed in the disclosure, since the first electrode has the hemispherical recesses, a surface area of the first electrode is increased. In this way, a capacitance value of the capacitor is effectively increased, thereby enhancing an electrical performance of the semiconductor device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
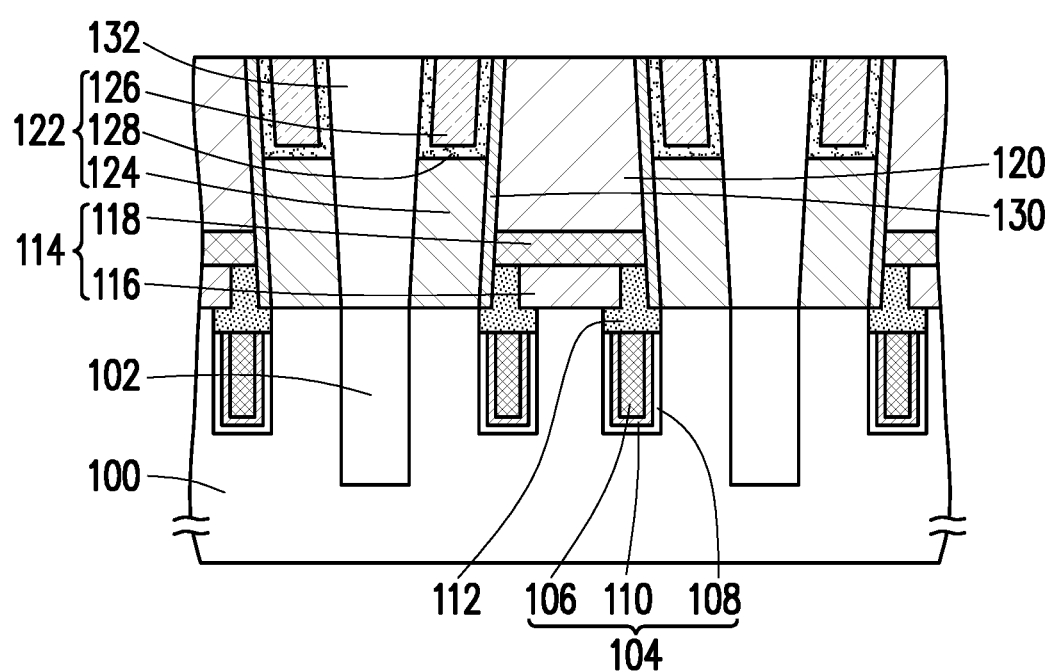
FIGS. 1A-1N are cross-sectional views of a manufacturing process of a semiconductor device according to an embodiment of the disclosure.
Figure 1B:
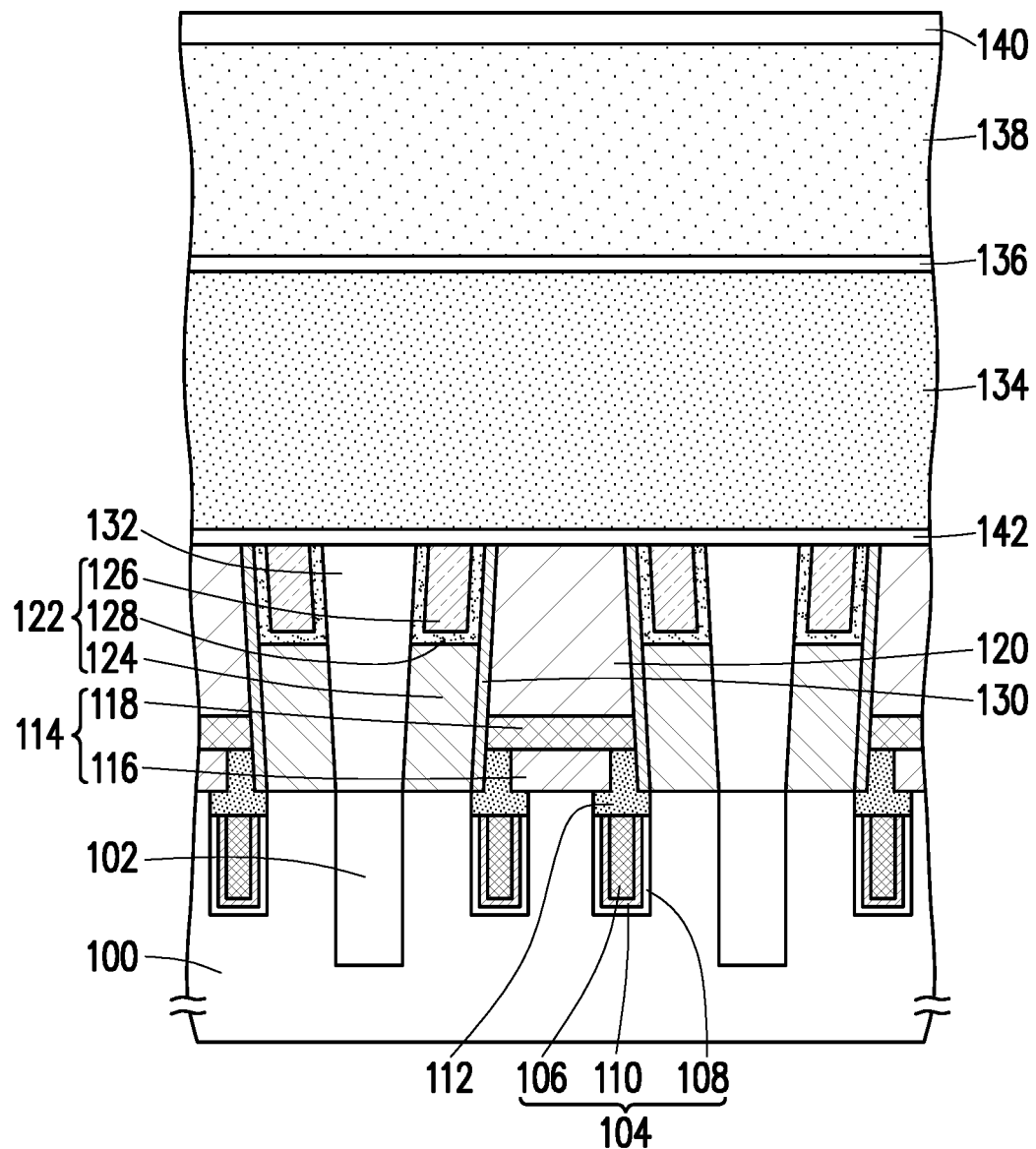
Figure 1C:
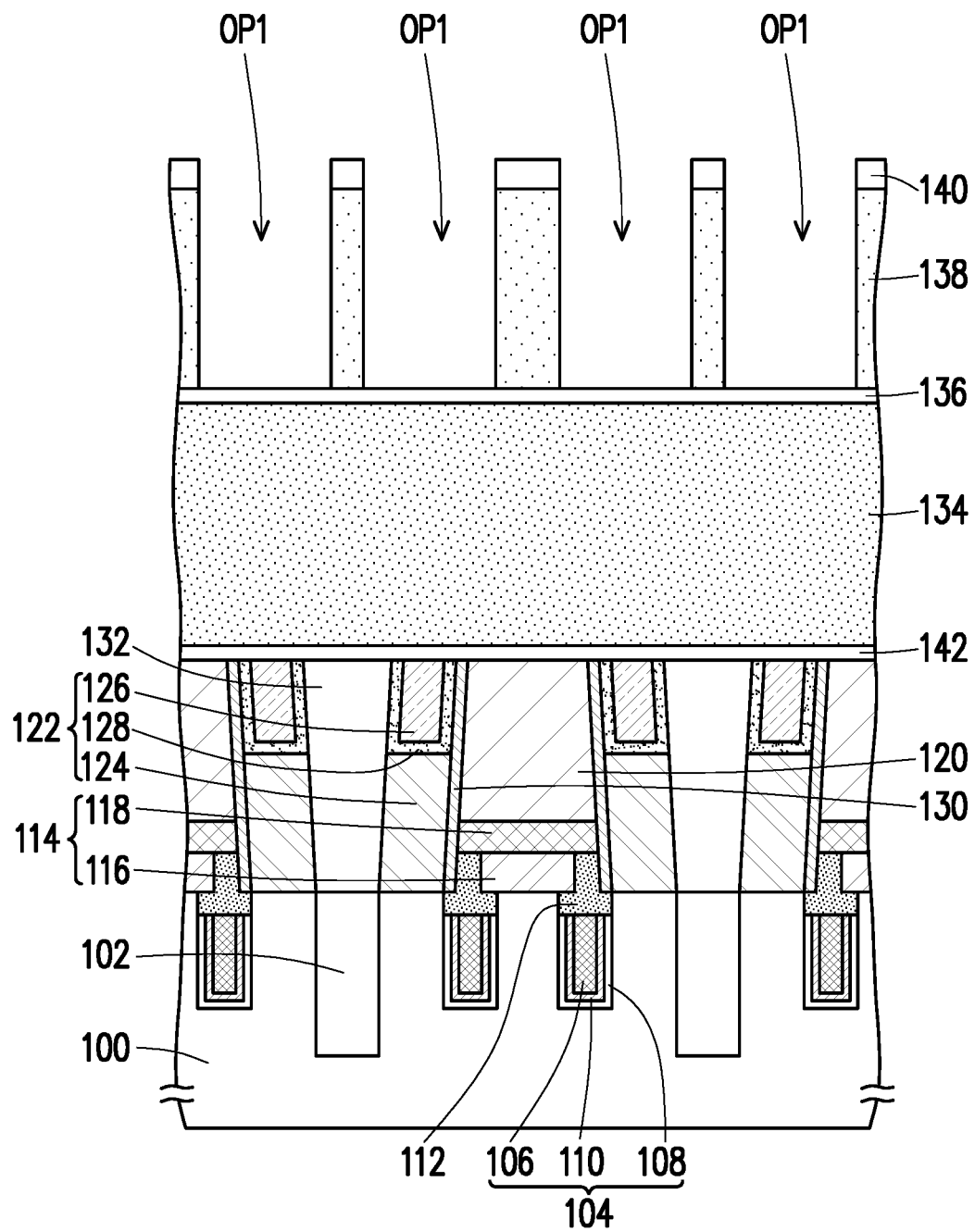
Figure 1D:
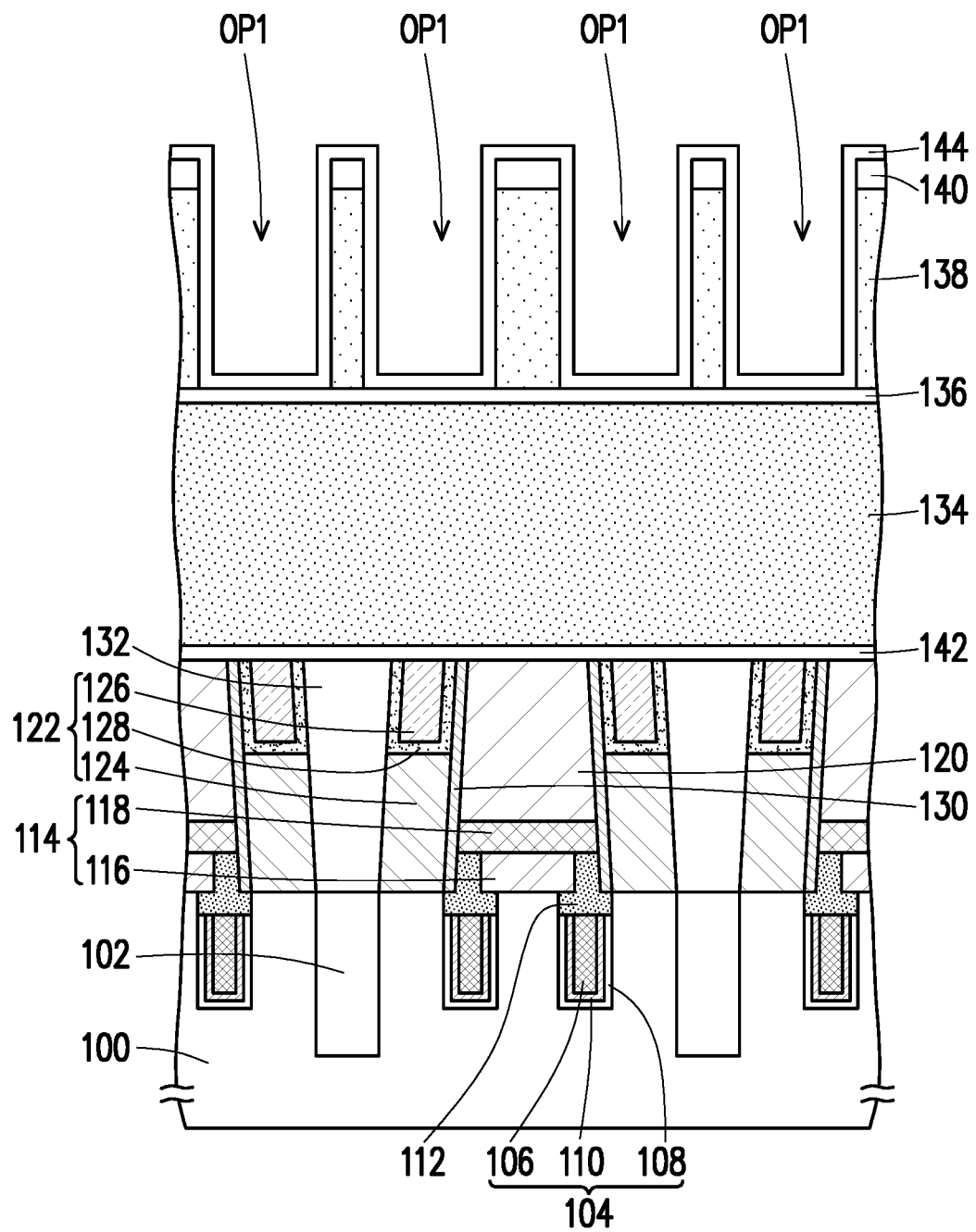
Figure 1E:
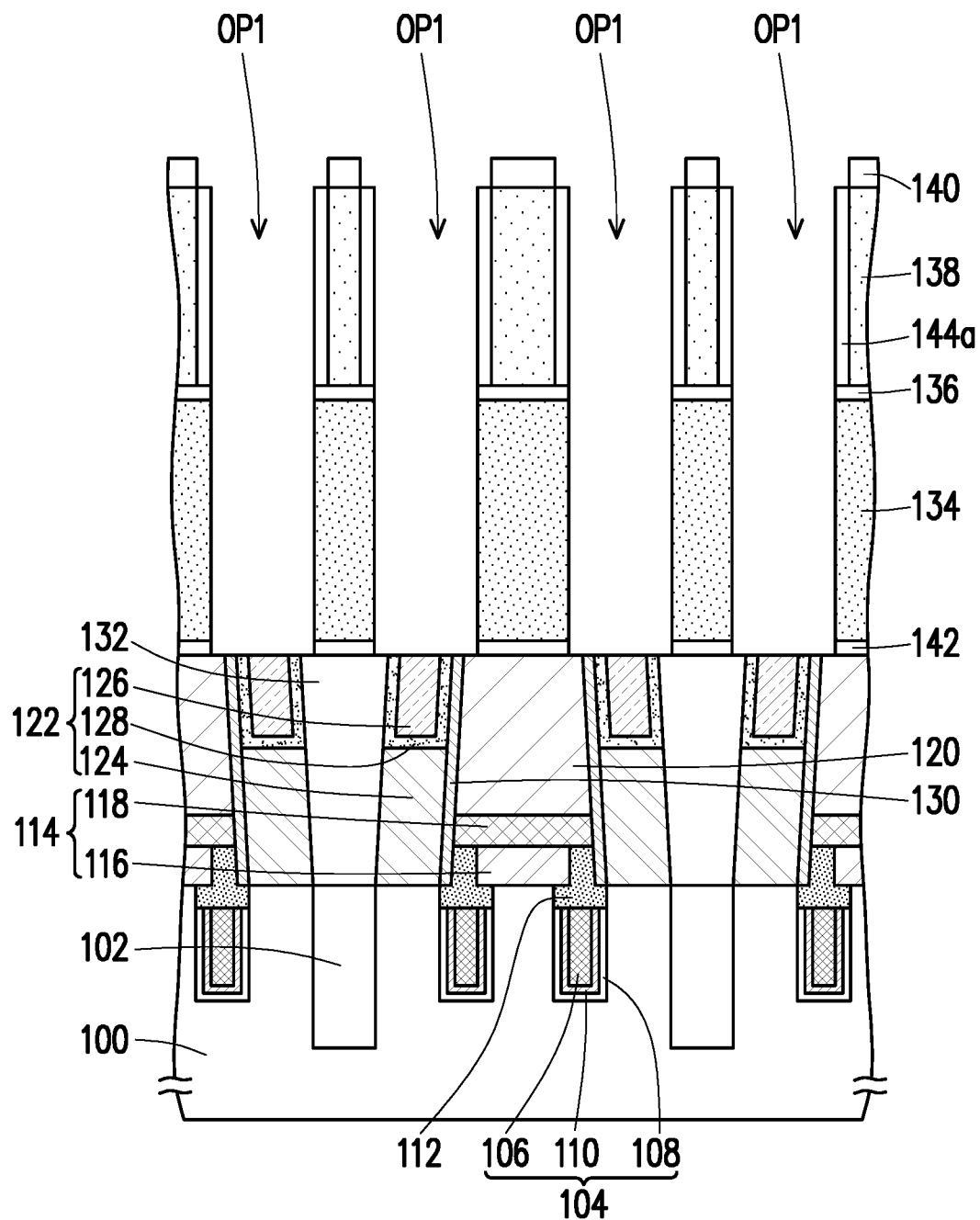
Figure 1F:
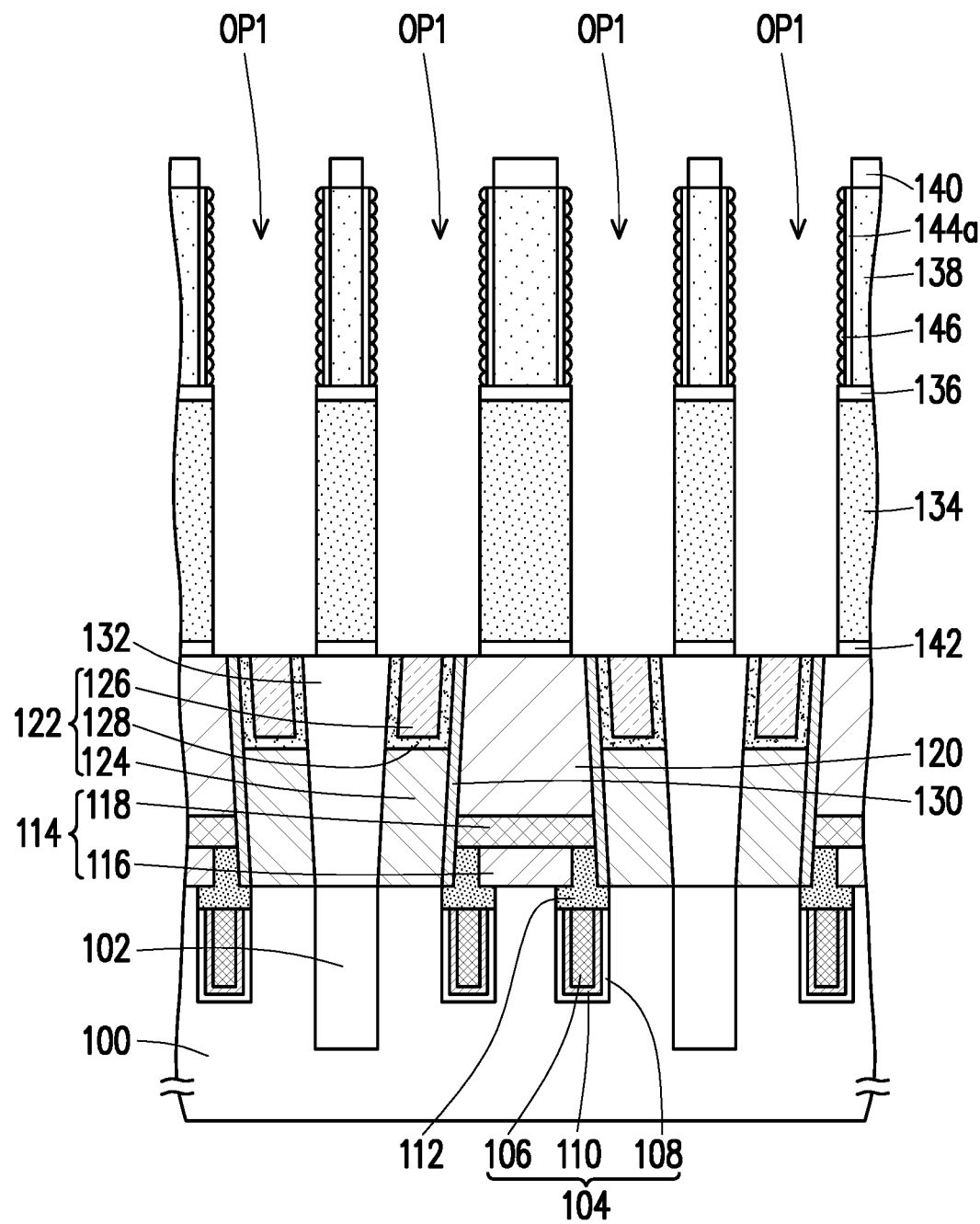
Figure 1G:
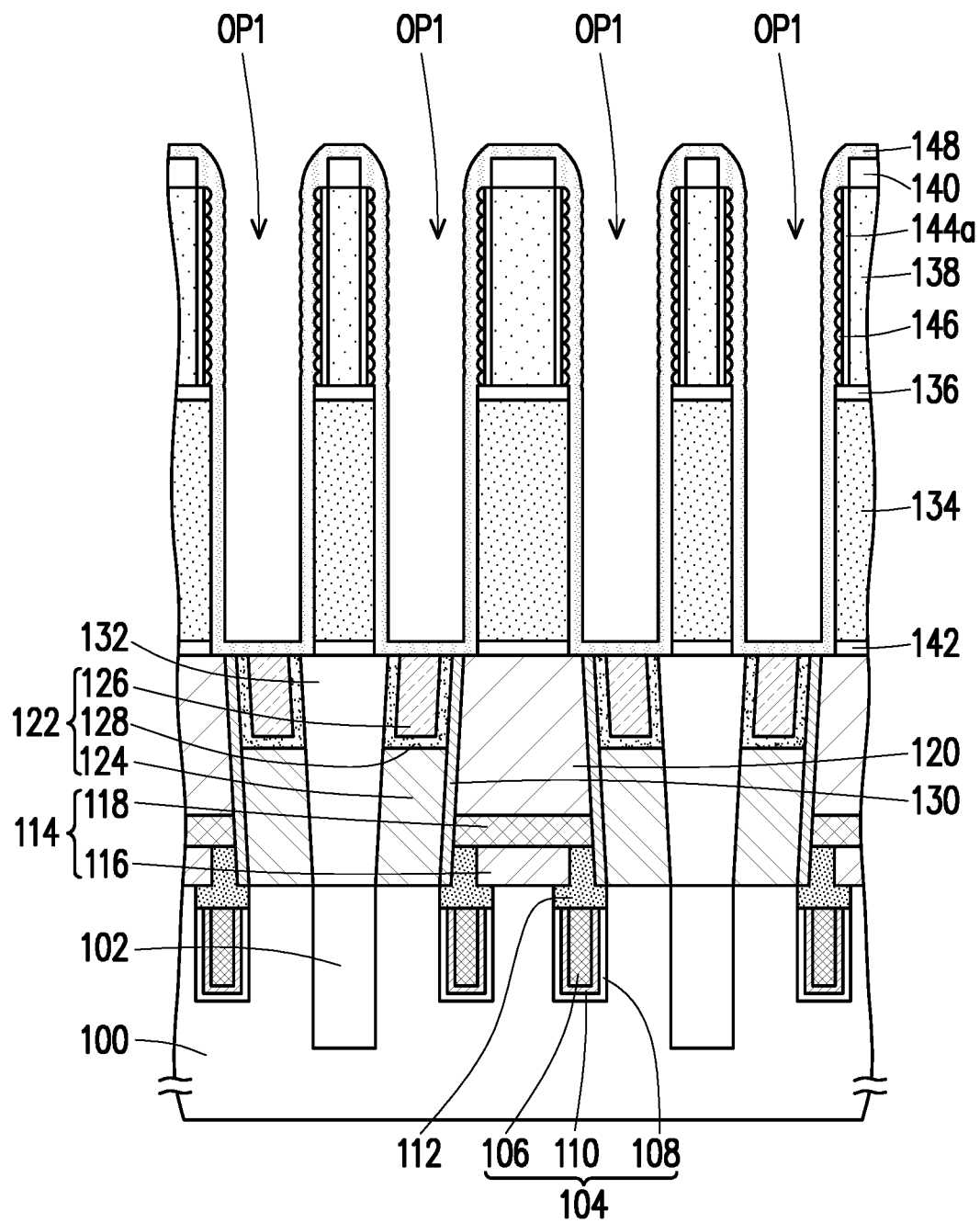
Figure 1H:
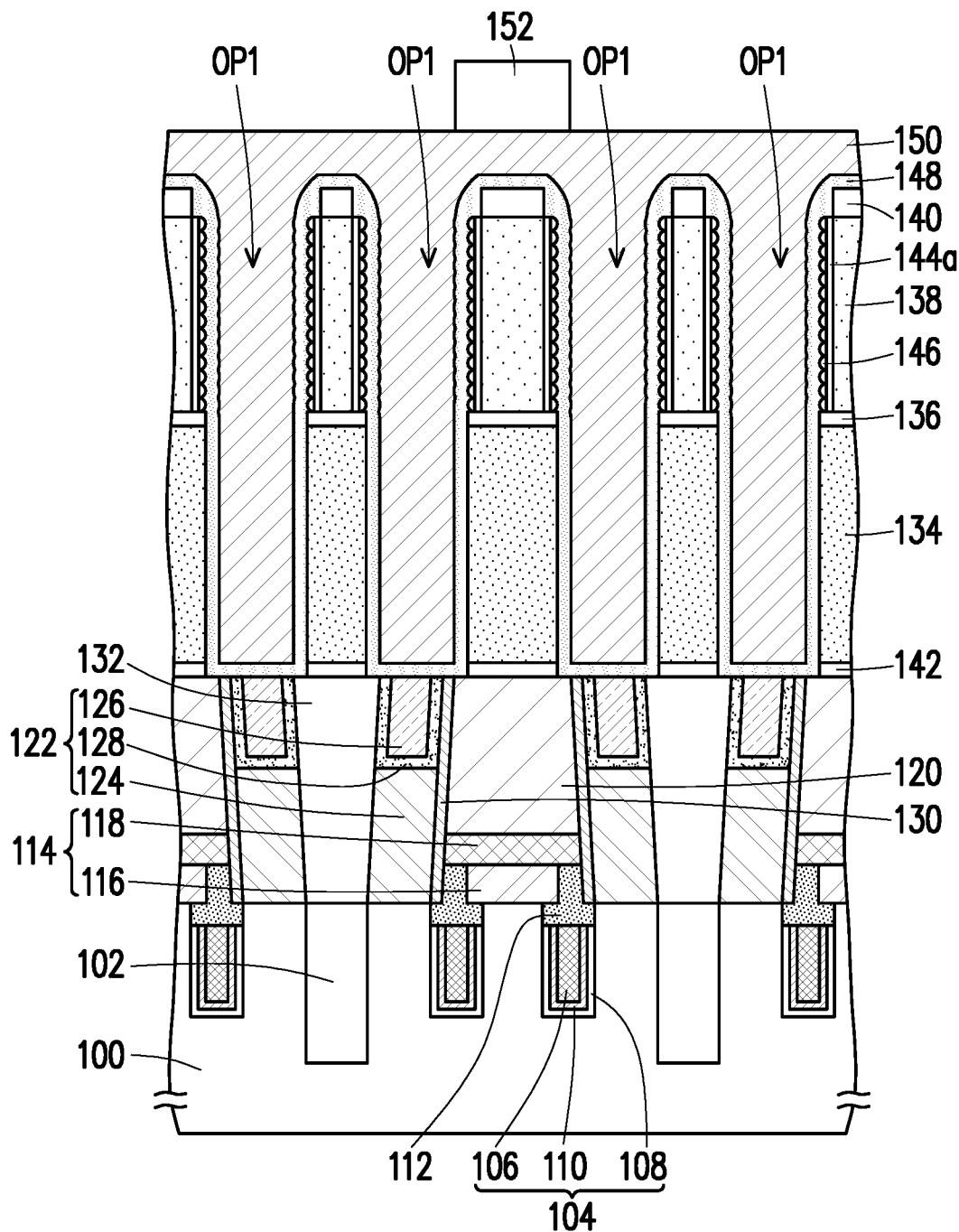
Figure 1I:
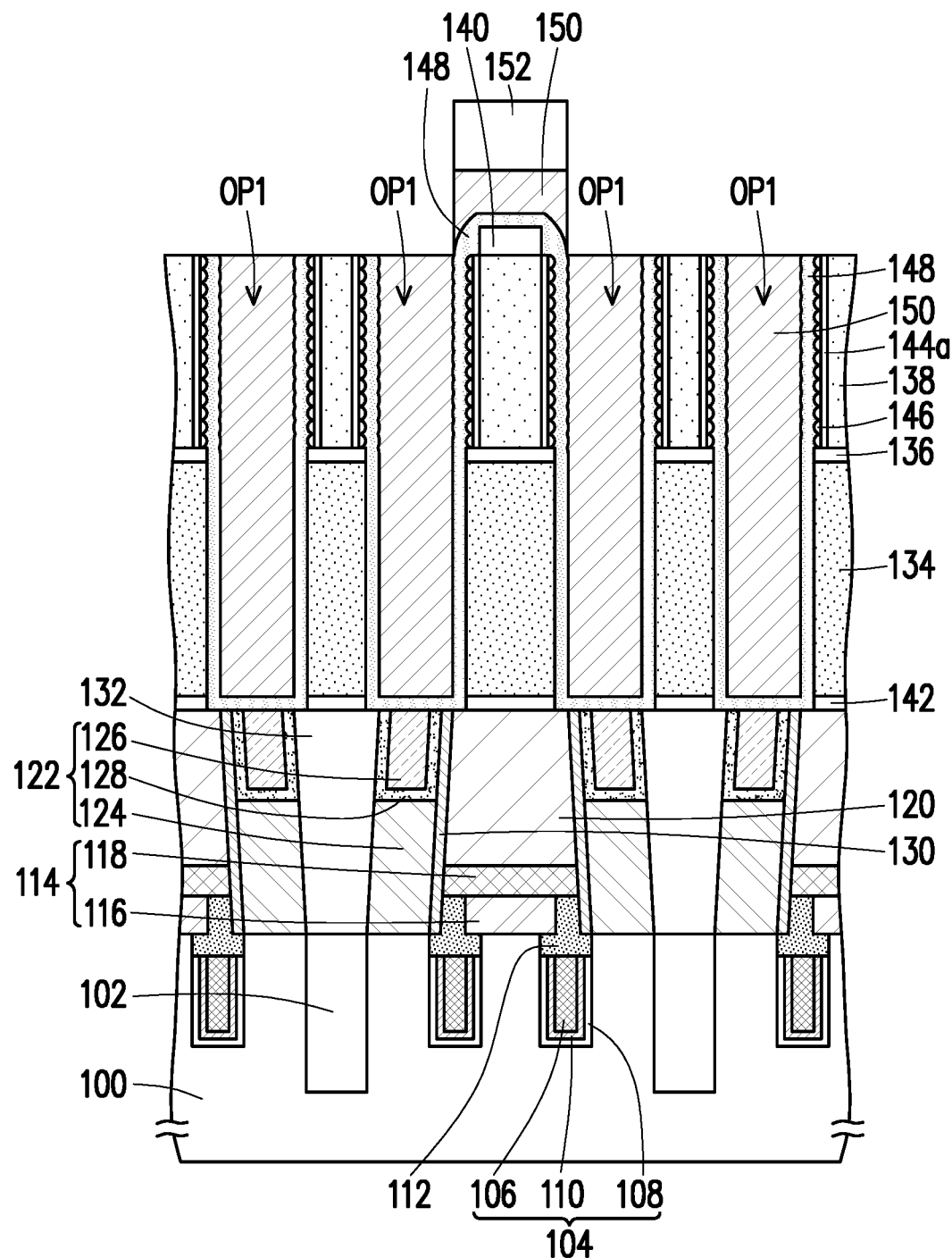
Figure 1J:
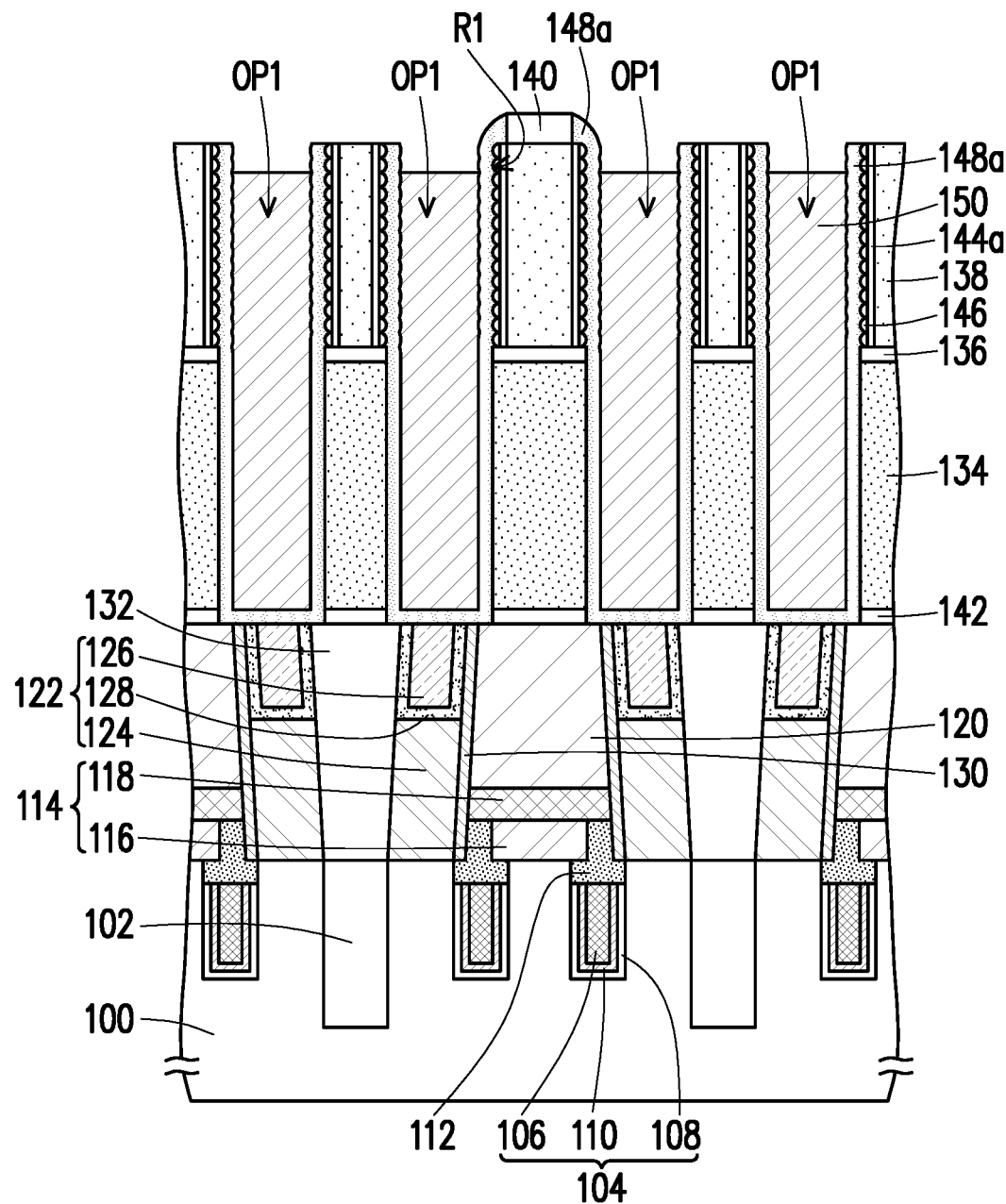
Figure 1K:
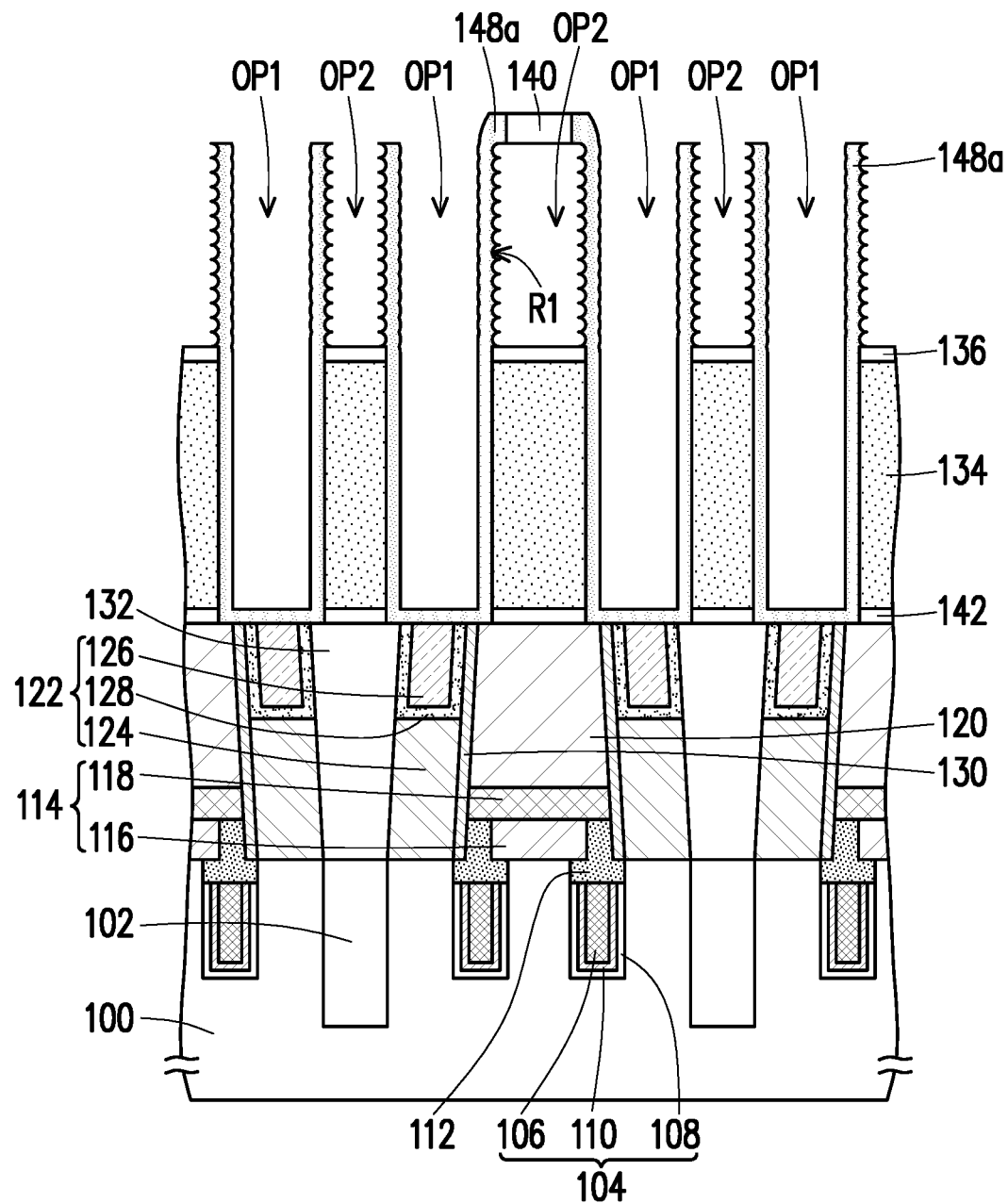
Figure 1L:
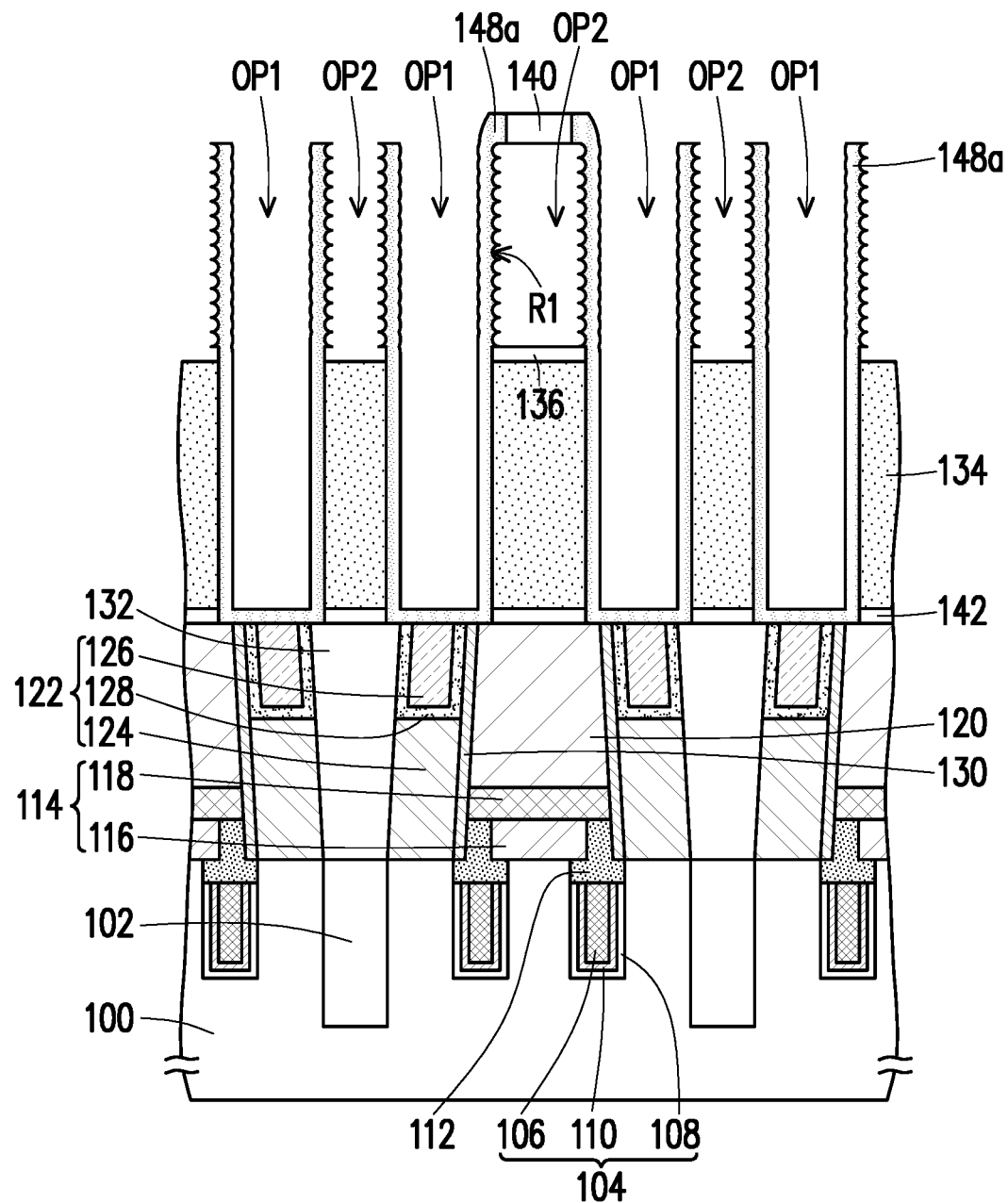
Figure 1M:
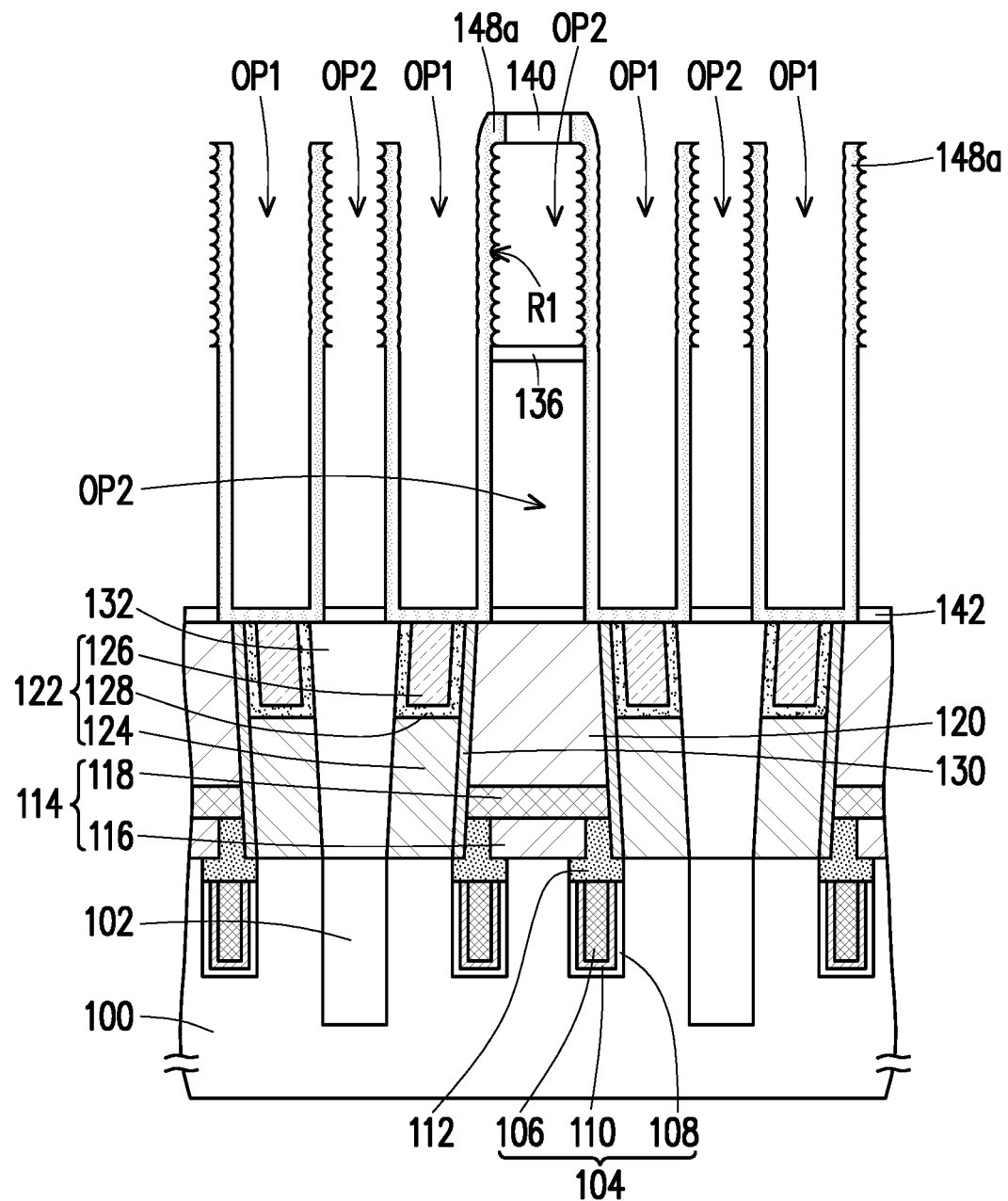
Figure 1N:
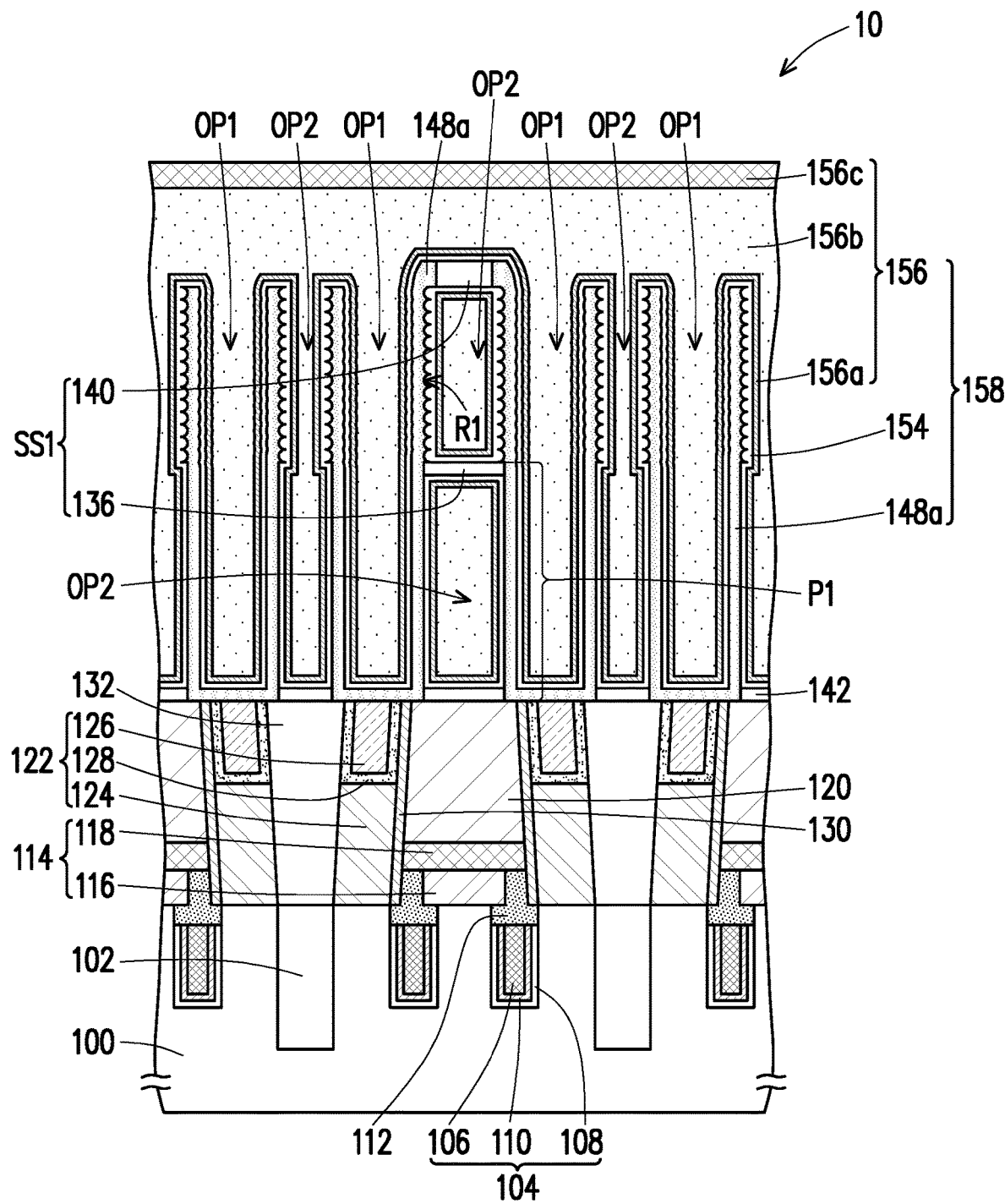

FIGS. 1A-1N are cross-sectional views of a manufacturing process of a semiconductor device according to an embodiment of the disclosure.

Referring to FIG. 1A, a substrate 100 is provided. The substrate 100 may be a semiconductor substrate, such as a silicon substrate. In addition, depending on the type of the semiconductor device, there may be corresponding components on the substrate 100. In the embodiment, the semiconductor device is, for example, a dynamic random access memory (DRAM), but the disclosure is not limited thereto. In addition, an isolation structure 102 may be formed in the substrate 100. The isolation structure 102 may be a single-layer structure or a multi-layer structure. The isolation structure 102 is, for example, a shallow trench isolation (STI) structure. A material of the isolation structure 102 is, for example, silicon oxide.

An embedded word line structure 104 may be formed in the substrate 100. The embedded word line structure 104 may include an embedded word line 106 and a dielectric layer 108. The embedded word line 106 is located in the substrate 100. A material of the embedded word line 106 is, for example, tungsten (W), aluminum (Al), or copper (Cu). The dielectric layer 108 is located between the embedded word line 106 and the substrate 100. A material of the dielectric layer 108 is, for example, silicon oxide. In addition, the embedded word line structure 104 may further include a barrier layer 110. The barrier layer 110 is located between the embedded word line 106 and the dielectric layer 108. A material of the barrier layer 110 is, for example, titanium (Ti), titanium nitride (TiN), tantalum (Ta), tantalum nitride (TaN), or a combination thereof. In addition, a top cover layer 112 may be formed on the embedded word line structure 104. A material of the top cover layer 112 is, for example, silicon nitride. In addition, a required doped region (not shown) may be formed in the substrate 100 according to product requirements.

A bit line structure 114 may be formed on the substrate 100 on one side of the embedded word line structure 104. The bit line structure 114 may include a contact 116 and a wire 118. The contact 116 is located on the substrate 100. The contact 116 may be used as a bit line contact. A material of the contact 116 is, for example, a conductive material such as doped polysilicon, etc. The wire 118 is located on the contact 116. The wire 118 may be used as a bit line. A material of the wire 118 is, for example, tungsten, aluminum, or copper. In addition, a hard mask layer 120 may be formed on the bit line structure 114. A material of the hard mask layer 120 is, for example, silicon nitride.

A contact structure 122 may be formed on the substrate 100 on the other side of the embedded word line structure 104. The contact structure 122 may be used as a storage node contact. The contact structure 122 may include a contact 124 and a contact 126. The contact 124 is located on the substrate 100. A material of the contact 124 is, for example, a conductive material such as doped polysilicon, etc. The contact 126 is located on the contact 124. A material of the contact 126 is, for example, a conductive material such as tungsten, aluminum, or copper. In addition, the contact structure 122 may further include a barrier layer 128. The barrier layer 128 is located between the contact 124 and the contact 126. A material of the barrier layer 110 is, for example, titanium, titanium nitride, tantalum, tantalum nitride, or a combination thereof.

Moreover, a filling layer 130 may be formed between the contact structure 122 and the bit line structure 114. Namely, the filling layer 130 may be located between the contact structure 122 and the bit line structure 114. The filling layer 130 may further be located between the contact structure 122 and the top cover layer 112 and between the contact structure 122 and the hard mask layer 120. A material of the filling layer 130 is, for example, a dielectric material such as silicon nitride. In addition, a dielectric layer 132 may be formed between two adjacent contact structures 122. A material of the dielectric layer 132 is, for example, silicon nitride.

Referring to FIG. 1B, a dielectric layer 134, a support layer 136, a dielectric layer 138, and a support layer 140 may be sequentially formed on the substrate 100. A material of the dielectric layer 134 is, for example, silicon oxide, such as borophosphosilicate glass (BPSG). A method of forming the dielectric layer 134 is, for example, a chemical vapor deposition method. A material of the support layer 136 is, for example, a dielectric material such as silicon nitride. A method of forming the support layer 136 is, for example, the chemical vapor deposition method. A material of the dielectric layer 138 is, for example, silicon oxide. A method of forming the dielectric layer 138 is, for example, the chemical vapor deposition method. A material of the support layer 140 is, for example, a dielectric material such as silicon nitride. A method of forming the support layer 140 is, for example, the chemical vapor deposition method. In one embodiment, before the dielectric layer 134 is formed, a stop layer 142 may be formed on the substrate 100. A material of the stop layer 142 is, for example, a dielectric material such as silicon nitride. A method of forming the stop layer 142 is, for example, the chemical vapor deposition method. In addition, the stop layer 142 may cover the hard mask layer 120, the contact structure 122, the filling layer 130 and the dielectric layer 132. In addition, a thickness of the support layer 140 may be greater than a thickness of the support layer 136. For example, the thickness of the support layer 140 may be more than twice of the thickness of the support layer 136. In addition, the thickness of the support layer 140 may be greater than a thickness of the stop layer 142. For example, the thickness of the support layer 140 may be more than twice of the thickness of the stop layer 142.

Referring to FIG. 1C, openings OP1 may be formed in the support layer 140 and the dielectric layer 138. The openings OP1 may expose a sidewall of the support layer 140 and a sidewall of the dielectric layer 138. A method for forming the openings OP1 is, for example, to pattern the support layer 140 and the dielectric layer 138 by using a photolithography process and an etching process. In addition, in the etching process for forming the openings OP1, the support layer 136 may be used as an etching stop layer.

Referring to FIG. 1D, a silicon material layer 144 may be formed on the support layer 140, the dielectric layer 138, and the support layer 136. In some embodiments, the silicon material layer 144 may be conformally formed on the support layer 140, the dielectric layer 138 and the support layer 136. A material of the silicon material layer 144 is, for example, amorphous silicon or doped polysilicon (for example, boron-doped polysilicon). A method of forming the silicon material layer 144 is, for example, the chemical vapor deposition method.

Referring to FIG. 1E, an etch-back process may be performed on the silicon material layer 144 to remove the silicon material layer 144 on a top surface of the support layer 140 and the support layer 136. In this way, a silicon spacer 144a may be formed on a sidewall of the dielectric layer 138 exposed by the opening OP1. In some embodiments, the silicon material layer 144 on the sidewall of the support layer 140 may be further removed. The etch-back process is, for example, a dry etching process.

In addition, the opening OP1 may be extended into the support layer 136, the dielectric layer 134, and the stop layer 142. For example, the silicon spacer 144a and the support layer 140 may be used as a mask to remove a part of the support layer 136, a part of the dielectric layer 134, and a part of the stop layer 142. The method of removing a part of the support layer 136, a part of the dielectric layer 134 and a part of the stop layer 142 is, for example, a dry etching method. In the embodiment, the opening OP1 may expose the contact structure 122.

Referring to FIG. IF, a thermal process may be performed on the silicon spacer 144a to form a plurality of hemispherical grains 146 on the silicon spacer 144a. A material of the hemispherical grain 146 is, for example, a silicon material (for example, polysilicon). The thermal process is, for example, a tempering process. A temperature range of the thermal process may be 500° C. to 1000° C. In some embodiments, the temperature range of the thermal process may be 600° C. to 800° C. In some embodiments, the temperature range of the thermal process may be 700° C. to 800° C.

Referring to FIG. 1G, an electrode material layer 148 may be formed in the openings OP1. In addition, the electrode material layer 148 may be further formed on the support layer 140. In some embodiments, the electrode material layer 148 may be conformally formed in the openings OP1 and on the support layer 140. The electrode material layer 148 covers the hemispherical grains 146. A material of the electrode material layer 148 is, for example, a metal compound (for example, titanium nitride) or metal (for example, titanium or tantalum). A method of forming the electrode material layer 148 is, for example, the chemical vapor deposition method.

Referring to FIG. 1H, a dielectric layer 150 may be formed on the electrode material layer 148. The dielectric layer 150 fills the openings OP1. A material of the dielectric layer 150 is, for example, silicon oxide. A method of forming the dielectric layer 150 is, for example, the chemical vapor deposition method.

Then, a patterned photoresist layer 152 may be formed on the dielectric layer 150. The patterned photoresist layer 152 may be located above a part of the support layer 140. The patterned photoresist layer 152 may be formed by a photolithography process.

Referring to FIG. 1I, the patterned photoresist layer 152 may be used as a mask to remove a part of the dielectric layer 150, a part of the electrode material layer 148, and a part of the support layer 140 to expose a top surface of a part of the dielectric layer 138. In this way, a part of the electrode material layer 148 located above the top surface of the part of the dielectric layer 138 may be removed. The part of the dielectric layer 150, the part of the electrode material layer 148, and the part of the support layer 140 may be respectively removed by an etching process (for example, a dry etching process).

Referring to FIG. 1J, the patterned photoresist layer 152 is removed. A method of removing the patterned photoresist layer 152 is, for example, a dry stripping method or a wet stripping method.

Then, a part of the dielectric layer 150 may be removed to expose a part of the electrode material layer 148 on the support layer 140. A method for removing the part of the dielectric layer 150 is, for example, the dry etching method.

Then, a part of the electrode material layer 148 may be removed to expose a top surface of the support layer 140. In this way, a part of the electrode material layer 148 located above the top surface of the dielectric layer 138 may be removed to form an electrode 148a. The electrode 148a may be used as a lower electrode of a capacitor. A method of removing the part of the electrode material layer 148 is, for example, the dry etching method.

Furthermore, the electrode 148a is located on the substrate 100. For example, the electrode 148a may be electrically connected to the contact structure 122. The electrode 148a has a plurality of hemispherical recesses R1, thereby increasing a surface area of the electrode 148a. A method for forming the hemispherical recesses R1 is, for example, to use the hemispherical grains 146 as a mold for formation.

Referring to FIG. 1K, after the electrode 148a is formed, the dielectric layer 138, the dielectric layer 150, the silicon spacer 144a and the hemispherical grains 146 are removed to form openings OP2. Therefore, in the embodiment, the lower electrode of the capacitor does not include the silicon spacer 144a and the hemispherical grains 146. The dielectric layer 138, the dielectric layer 150, the silicon spacer 144a, and the hemispherical grains 146 may be respectively removed by a wet etching process. An etchant used in the wet etching process for removing the dielectric layer 138 and the dielectric layer 150 is, for example, diluted hydrofluoric (DHF) acid. An etchant used in the wet etching process for removing the silicon spacer 144a and the hemispherical grains 146 is, for example, nitric acid.

Referring to FIG. 1L, a part of the support layer 136 is removed to expose a part of the dielectric layer 134. A method of removing the part of the support layer 136 is, for example, the dry etching method.

Referring to FIG. 1M, the dielectric layer 134 is removed. In this way, a range of the opening OP2 may be enlarged. The dielectric layer 134 may be removed by a wet etching process. An etchant used in the wet etching process for removing the dielectric layer 134 is, for example, DHF acid.

Referring to FIG. 1N, an insulating layer 154 may be formed on the electrode 148a. In some embodiments, the insulating layer 154 may be conformally formed on the electrode 148a. A material of the insulating layer 154 is, for example, a high-k material, such as tantalum pentoxide ($Ta_2O_5$) or zirconium oxide (ZrO). A method of forming the insulating layer 154 is, for example, the chemical vapor deposition method.

Then, an electrode 156 may be formed on the insulating layer 154. The electrode 156 fills the openings OP1 and the openings OP2. The electrode 156 may have a single-layer structure or a multi-layer structure. In the embodiment, the electrode 156 is, for example, a multilayer structure. For example, the electrode 156 may include a conductor layer 156a and a conductor layer 156b. The conductor layer 156a is located on the insulating layer 154. A material of the conductor layer 156a is, for example, a metal compound (for example, titanium nitride) or metal (for example, titanium or tantalum). A method of forming the conductor layer 156a is, for example, the chemical vapor deposition method. The conductor layer 156b is located on the conductor layer 156a. A material of the conductor layer 156b is, for example, a doped semiconductor material, such as boron-doped silicon germanium. A method of forming the conductor layer 156b is, for example, the chemical vapor deposition method. In addition, the electrode 156 may further include a conductor layer 156c. The conductor layer 156c is located on the conductor layer 156b. A material of the conductor layer 156c is, for example, metal, such as tungsten. A method of forming the conductor layer 156c is, for example, a physical vapor deposition method.

Based on the above method, a plurality of capacitors 158 may be formed on the substrate 100, but the disclosure is not limited thereto. As long as the number of the capacitors 158 is more than one, it falls within the scope of the disclosure. The capacitor 158 includes the electrode 148a, the electrode 156 and the insulating layer 154. In addition, based on the above method, a support structure SS1 connected between adjacent two of the electrodes 148a of adjacent two of the capacitors 158 may be formed. For example, the support structure SS1 may include the support layer 136 and the support layer 140.

Hereinafter, the semiconductor device 10 of the above embodiment is described with reference to FIG. 1N. In addition, although the aforementioned method is taken as an example to describe the method for forming the semiconductor device 10, the disclosure is not limited thereto.

Referring to FIG. 1N, the semiconductor device 10 includes the substrate 100 and the capacitor 158. In the embodiment, the semiconductor device 10 may include a plurality of the capacitors 158. The capacitor 158 may be a cylinder capacitor, but the disclosure is not limited thereto. The capacitor 158 includes the electrode 148a, the electrode 156 and the insulating layer 154. The electrode 148a is located on the substrate 100. The electrode 148a has a plurality of hemispherical recesses R1. A shape of the electrode 148a is, for example, a cylindrical shape. A material of the electrode 148a is, for example, a metal compound (for example, titanium nitride) or metal (for example, titanium or tantalum). The electrode 156 is located on the electrode 148a. The insulating layer 154 is located between the electrode 148a and the electrode 156. Surfaces of the hemispherical recesses R1 are in direct contact with the insulating layer 154.

In addition, the semiconductor device 10 may further include the support structure SS1. The support structure SS1 is connected between adjacent two of the electrodes 148a of adjacent two of the capacitors 158. The support structure SS1 may be a single layer structure or a multi-layer structure. For example, the support structure SS1 may include the support layer 136 and the support layer 140. The support layer 136 may be connected between adjacent two of the electrodes 148a of adjacent two of the capacitors 158. The support layer 140 may be connected between adjacent two of the electrodes 148a of adjacent two of the capacitors 158. In some embodiments, the support layer 136 and the support layer 140 may be directly connected between adjacent two of the electrodes 148a of adjacent two of the capacitors 158. The support layer 136 may be located between the support layer 140 and the substrate 100. Moreover, the electrode 148a located between the support layer 136 and the support layer 140 may have the hemispherical recesses R1. In the embodiment, a portion P1 of the electrode 148a lower than the top surface of the support layer 136 does not have the hemispherical recess. In the embodiment, two layers (i.e., the support layer 136 and the support layer 140) of the support layers included in the support structure SS1 are taken as an example for description, but the disclosure is not limited thereto. As long as the number of the support layers included in the support structure SS1 is more than one, it falls within the scope of the disclosure.

In addition, description of the remaining components in the semiconductor device 10 may be obtained by referring to the description of the aforementioned embodiment. In addition, the materials, arrangement methods, forming methods and effects of the components in the semiconductor device 10 have been described in detail in the aforementioned embodiment, which are not repeated.

Based on the above embodiment, it is known that in the semiconductor device 10 and the manufacturing method thereof proposed in the disclosure, since the electrode 148a has the hemispherical recesses R1, the surface area of the electrode 148a may be increased. In this way, a capacitance value of the capacitor 158 may be effectively increased, thereby improving an electrical performance of the semiconductor device 10 (for example, a DRAM).

FIGS. 2A-2K are cross-sectional views of a manufacturing process of a semiconductor device according to another embodiment of the disclosure. FIG. 2A to 2K are cross-sectional views of a manufacturing process following the step of FIG. 1A.

Figure 2A:
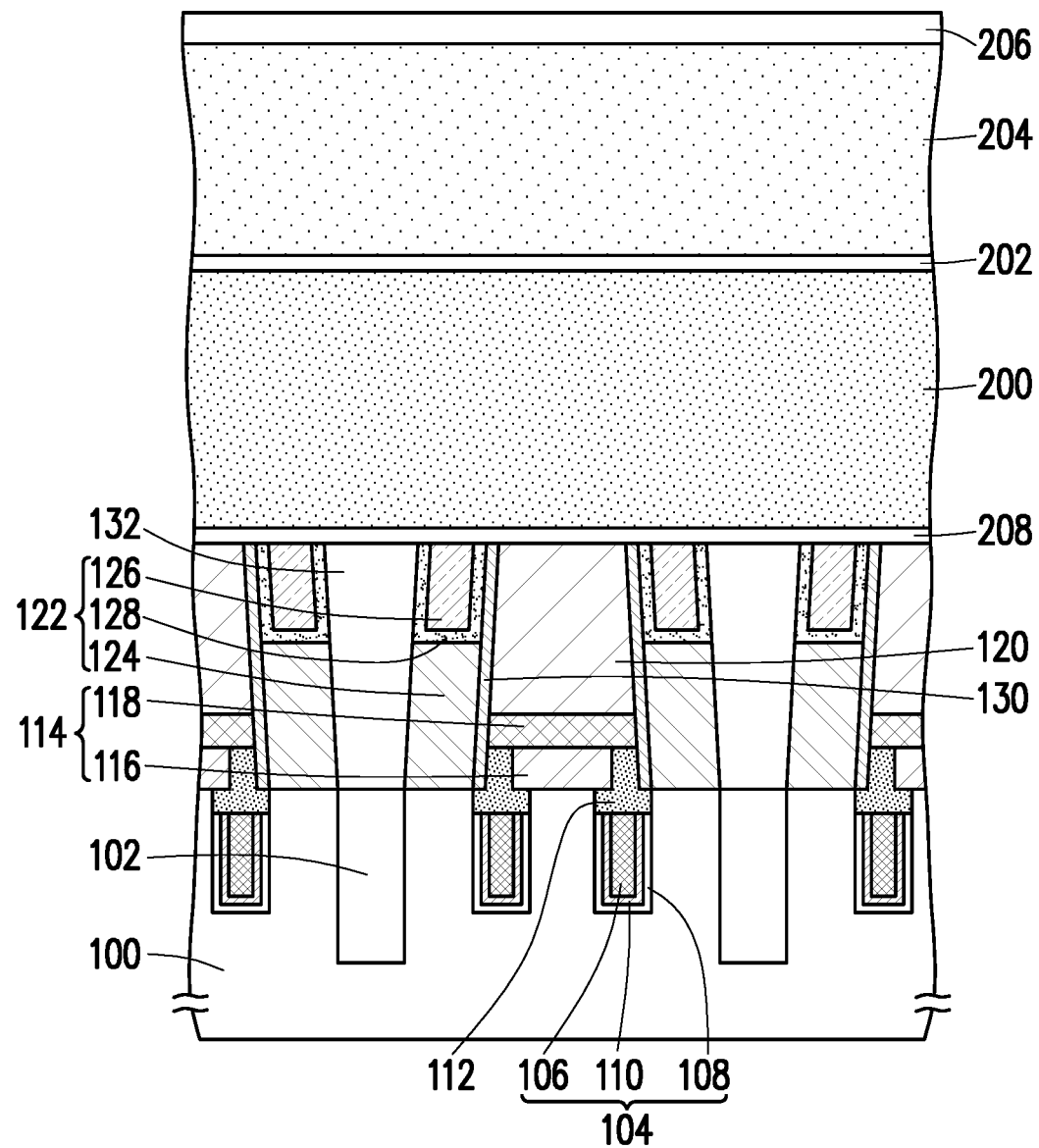
FIGS. 2A-2K are cross-sectional views of a manufacturing process of a semiconductor device according to another embodiment of the disclosure.

Referring to FIG. 2A, a silicon material layer 200, a support layer 202, a silicon material layer 204, and a support layer 206 may be sequentially formed on the substrate 100. A material of the silicon material layer 200 is, for example, amorphous silicon or doped polysilicon (for example, boron-doped polysilicon). A method of the silicon material layer 200 is, for example, the chemical vapor deposition method. A material of the support layer 202 is, for example, a dielectric material such as silicon nitride. A method of forming the support layer 202 is, for example, the chemical vapor deposition method. A material of the silicon material layer 204 is, for example, amorphous silicon or doped polysilicon (for example, boron-doped polysilicon). A method of forming the silicon material layer 204 is, for example, the chemical vapor deposition method. A material of the support layer 206 is, for example, a dielectric material such as silicon nitride. A method of forming the support layer 206 is, for example, the chemical vapor deposition method. In an embodiment, before forming the silicon material layer 200, a stop layer 208 may be formed on the substrate 100. A material of the stop layer 208 is, for example, a dielectric material such as silicon nitride. A method of forming the stop layer 208 is, for example, the chemical vapor deposition method. In addition, the stop layer 208 may cover the hard mask layer 120, the contact structure 122, the filling layer 130 and the dielectric layer 132.

Figure 2B:
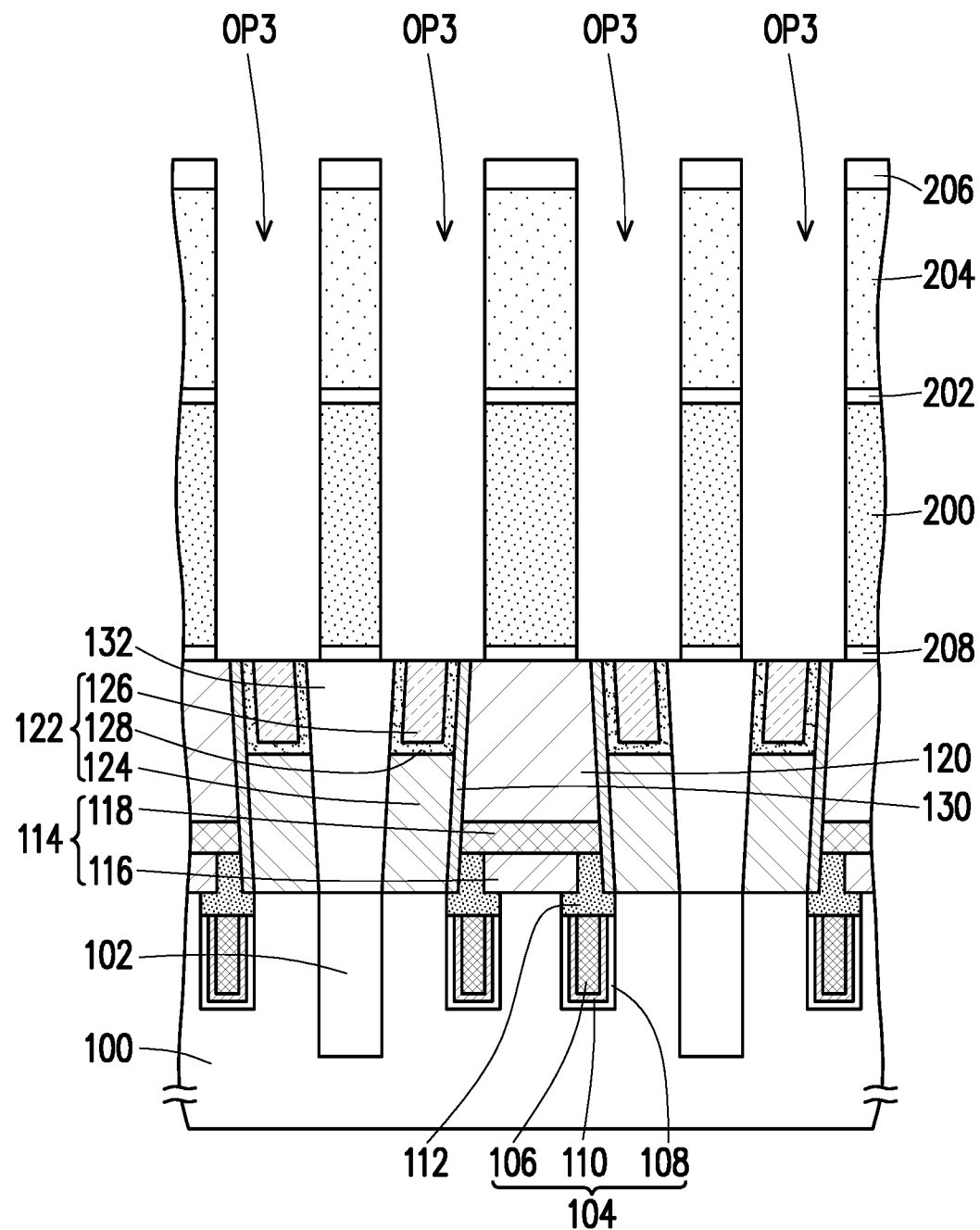

Referring to FIG. 2B, openings OP3 may be formed in the support layer 206, the silicon material layer 204, the support layer 202, the silicon material layer 200, and the stop layer 208. The opening OP3 may expose the contact structure 122. In addition, the opening OP3 may further expose a sidewall of the support layer 206, a sidewall of the silicon material layer 204, a sidewall of the support layer 202, a sidewall of the silicon material layer 200, and a sidewall of the stop layer 208. A method for forming the openings OP3 is, for example, to pattern the support layer 206, the silicon material layer 204, the support layer 202, the silicon material layer 200, and the stop layer 208 by using a photolithography process and an etching process.

Figure 2C:
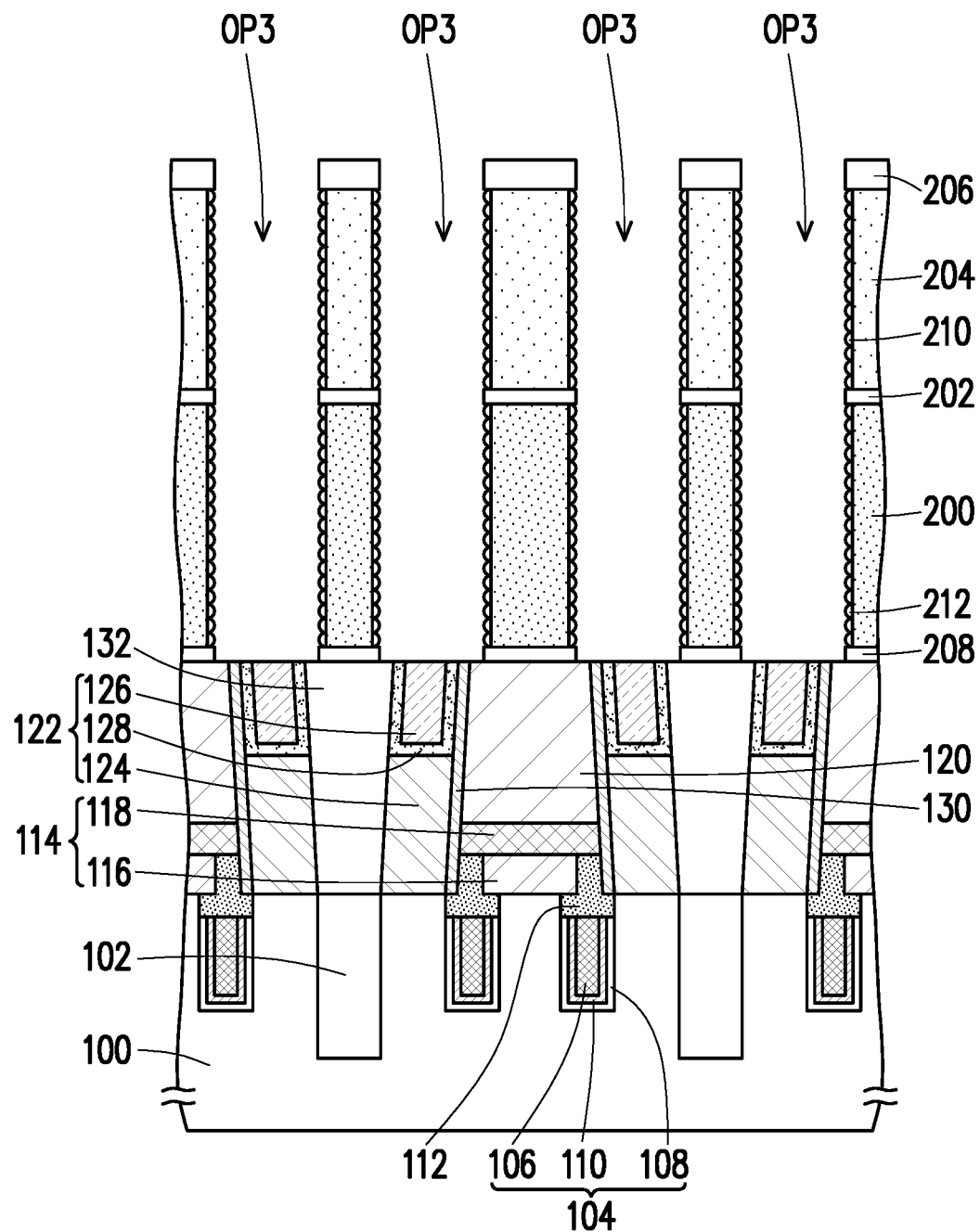

Referring to FIG. 2C, a thermal process may be performed on the silicon material layer 204 and the silicon material layer 200 to form a plurality of hemispherical grains 210 on the sidewall of the silicon material layer 204 exposed by the openings OP3, and form a plurality of hemispherical grains 212 on the sidewall of the silicon material layer 200 exposed by the openings OP3. A material of the hemispherical grains 210 and the hemispherical grains 212 is, for example, a silicon material (for example, polysilicon). The thermal process is, for example, a tempering process. A temperature range of the thermal process may be 500° C. to 1000° C. In some embodiments, the temperature range of the thermal process may be 600° C. to 800° C. In some embodiments, the temperature range of the thermal process may be 700° C. to 800° C.

Figure 2D:
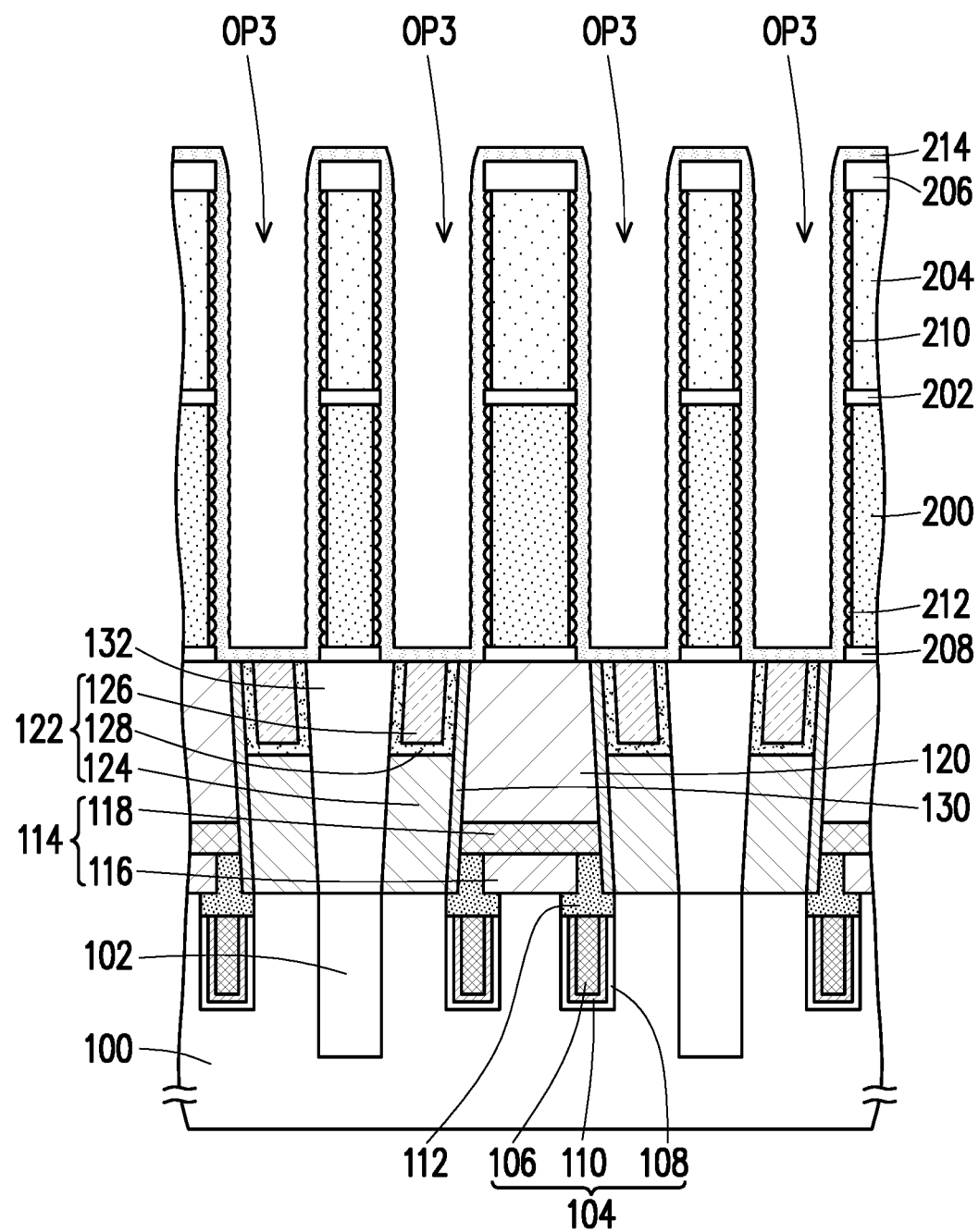

Referring to FIG. 2D, an electrode material layer 214 may be formed in the openings OP3. In addition, the electrode material layer 214 may be further formed on the support layer 206. In some embodiments, the electrode material layer 214 may be conformally formed in the openings OP3 and on the support layer 206. The electrode material layer 214 covers the hemispherical grains 210 and the hemispherical grains 212. A material of the electrode material layer 214 is, for example, a metal compound (for example, titanium nitride) or metal (for example, titanium or tantalum). A method of forming the electrode material layer 214 is, for example, the chemical vapor deposition method.

Figure 2E:
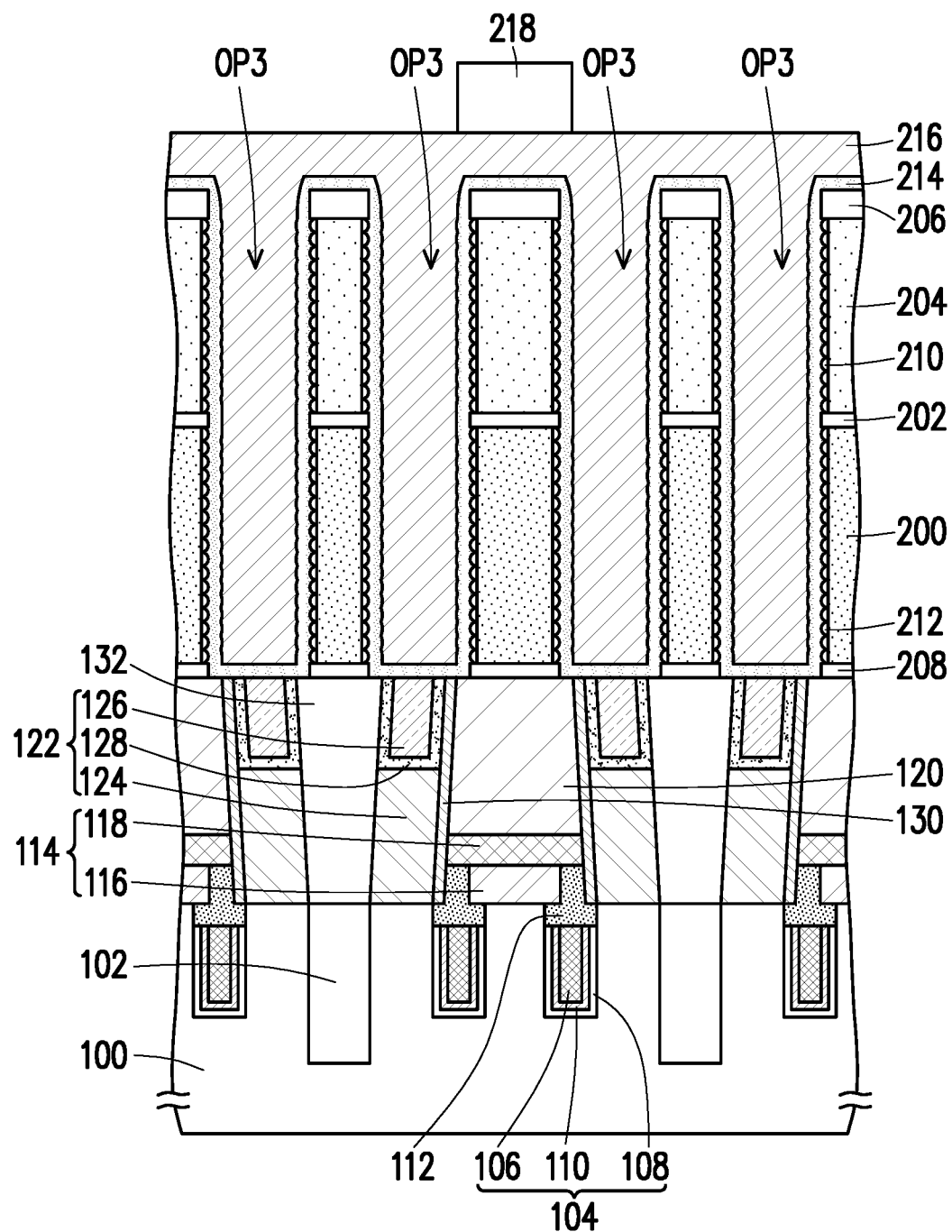

Referring to FIG. 2E, a dielectric layer 216 may be formed on the electrode material layer 214. The dielectric layer 216 fills the openings OP3. A material of the dielectric layer 216 is, for example, silicon oxide. A method of forming the dielectric layer 216 is, for example, the chemical vapor deposition method.

Then, a patterned photoresist layer 218 may be formed on the dielectric layer 216. The patterned photoresist layer 218 may be located above a part of the support layer 206. The patterned photoresist layer 218 may be formed by a photolithography process.

Figure 2F:
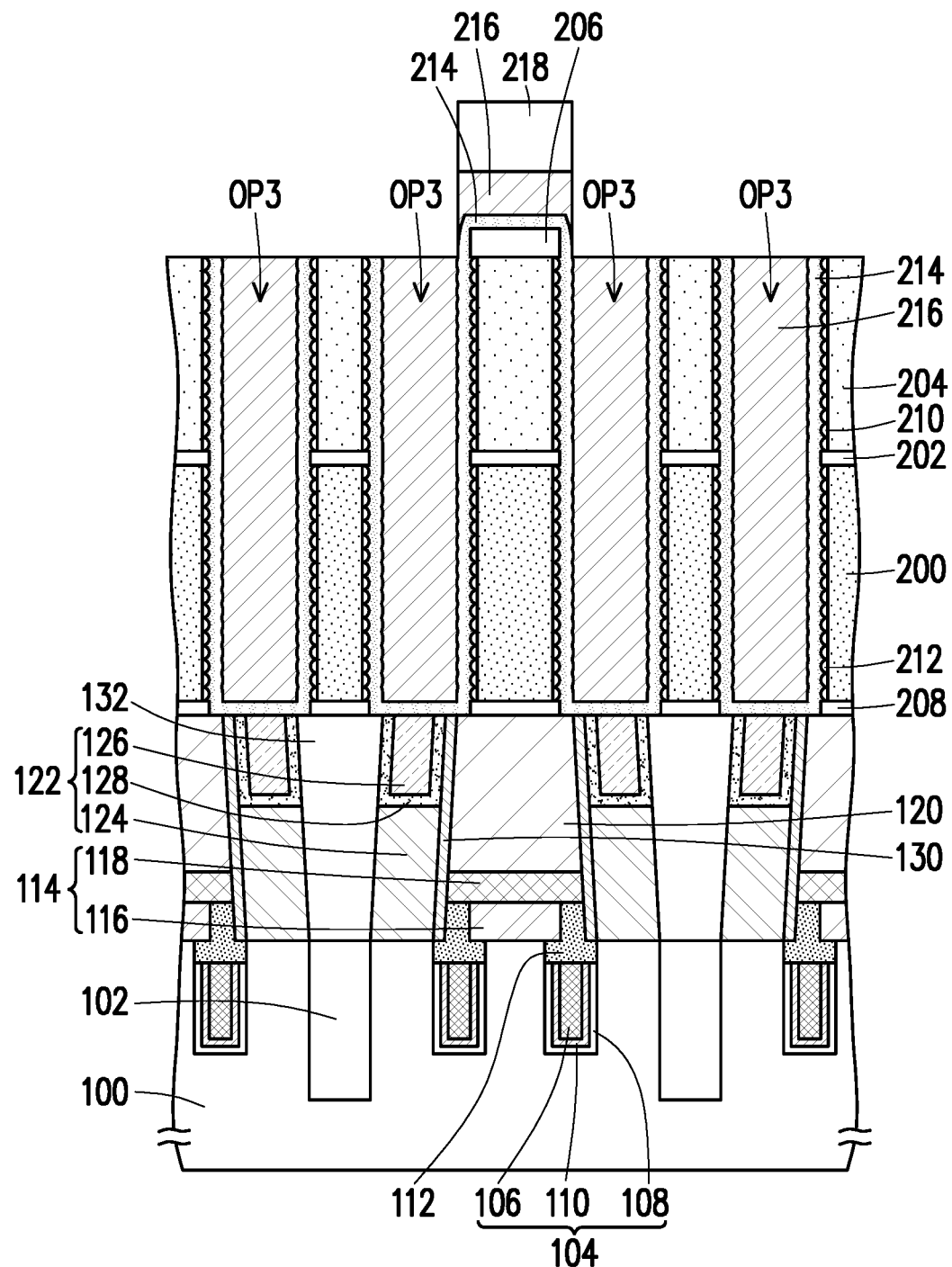

Referring to FIG. 2F, the patterned photoresist layer 218 may be used as a mask to remove a part of the dielectric layer 216, a part of the electrode material layer 214, and a part of the support layer 206 to expose a top surface of a part of the silicon material layer 204. In this way, the part of the electrode material layer 214 located above the top surface of the part of the silicon material layer 204 may be removed. The part of the dielectric layer 216, the part of the electrode material layer 214, and the part of the support layer 206 may be respectively removed by an etching process (for example, a dry etching process).

Figure 2G:
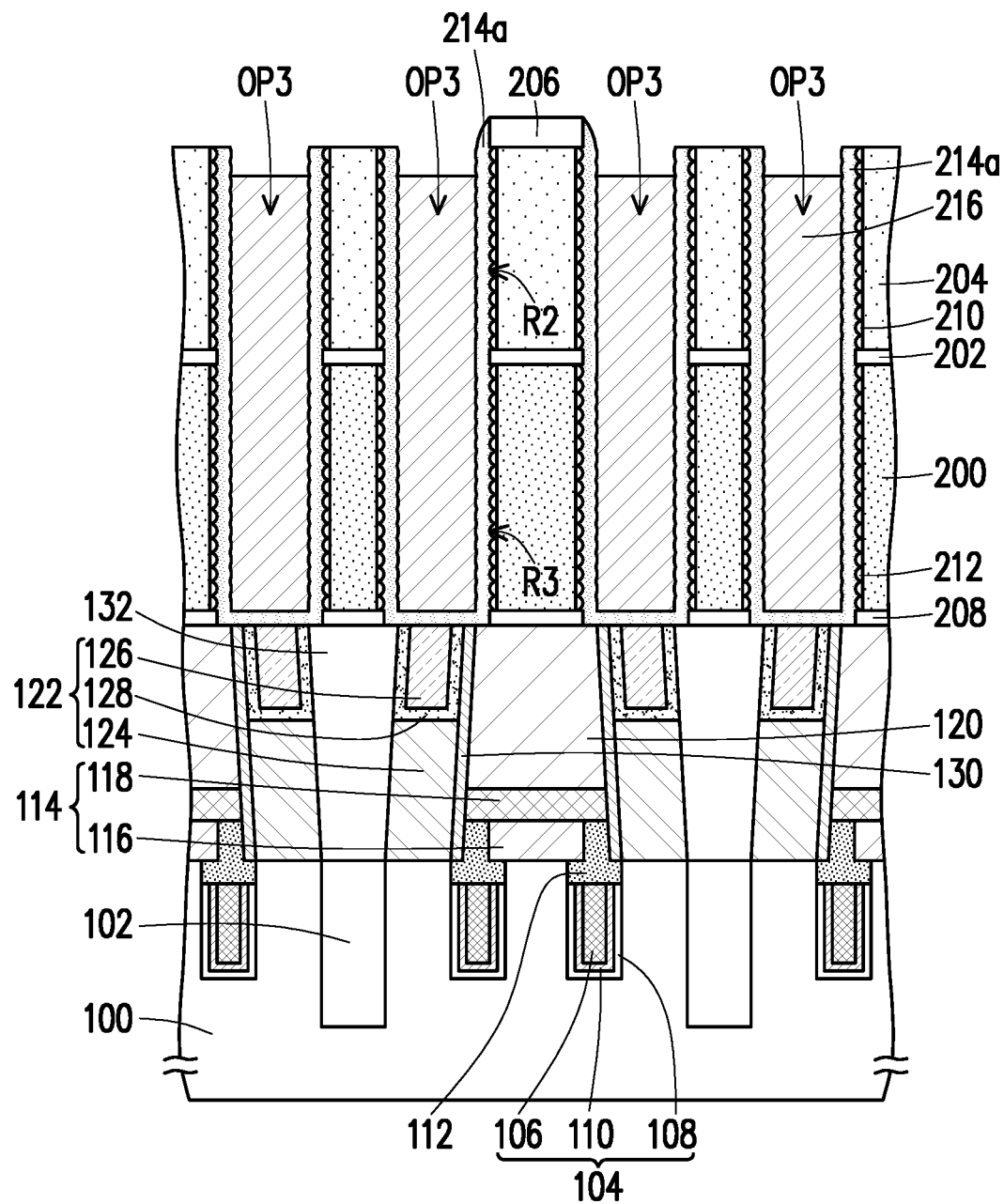

Referring to FIG. 2G, the patterned photoresist layer 218 is removed. A method for removing the patterned photoresist layer 218 is, for example, a dry peeling method or a wet peeling method.

Then, a part of the dielectric layer 216 may be removed to expose a part of the electrode material layer 214 on the support layer 206. A method for removing the part of the dielectric layer 216 is, for example, the dry etching method.

Then, a part of the electrode material layer 214 may be removed to expose a top surface of the support layer 206. In this way, a part of the electrode material layer 214 located above a top surface of the silicon material layer 204 may be removed to form an electrode 214a. The electrode 214a may be used as a lower electrode of a capacitor. A method for removing the part of the electrode material layer 214 is, for example, the dry etching method.

In addition, the electrode 214a is located on the substrate 100. For example, the electrode 214a may be electrically connected to the contact structure 122. The electrode 214a has a plurality of hemispherical recesses R2 and a plurality of hemispherical recesses R3, thereby increasing a surface area of the electrode 214a. A method of forming the hemispherical recesses R2 is, for example, to use the hemispherical grains 210 as a mold for formation. A method of forming the hemispherical recesses R3 is, for example, to use the hemispherical grains 212 as a mold for formation.

Figure 2H:
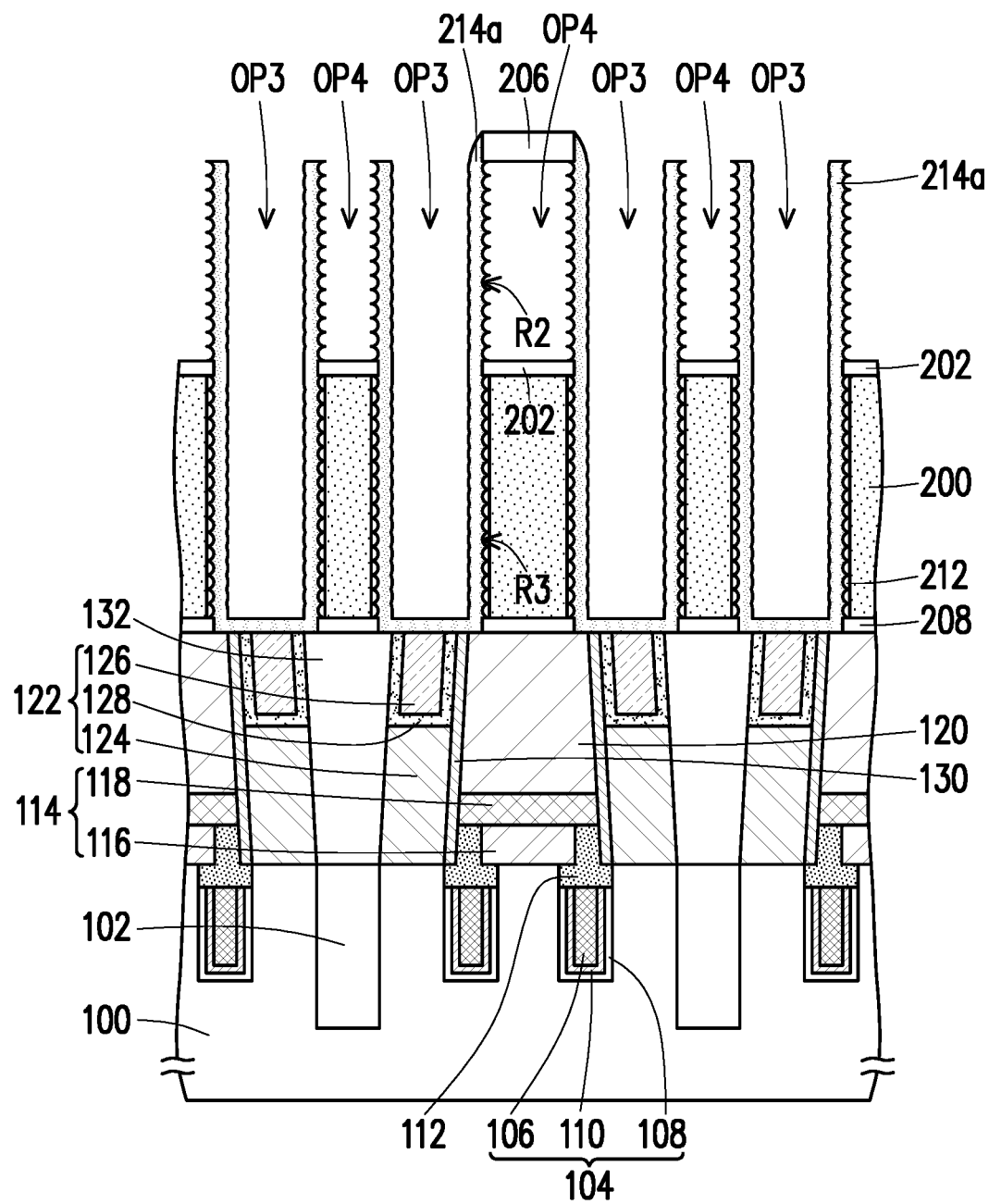

Referring to FIG. 2H, after the electrode 214a is formed, the dielectric layer 216, the silicon material layer 204, and the hemispherical gains 210 are removed to form openings OP4. Namely, in the embodiment, the lower electrode of the capacitor does not include the silicon material layer 204 and the hemispherical grains 210. The dielectric layer 216, the silicon material layer 204, and the hemispherical gains 210 may be respectively removed by a wet etching process. An etchant used in the wet etching process for removing the dielectric layer 216 is, for example, DHF acid. An etchant used in the wet etching process for removing the silicon material layer 204 and the hemispherical gains 210 is, for example, nitric acid.

Figure 2I:
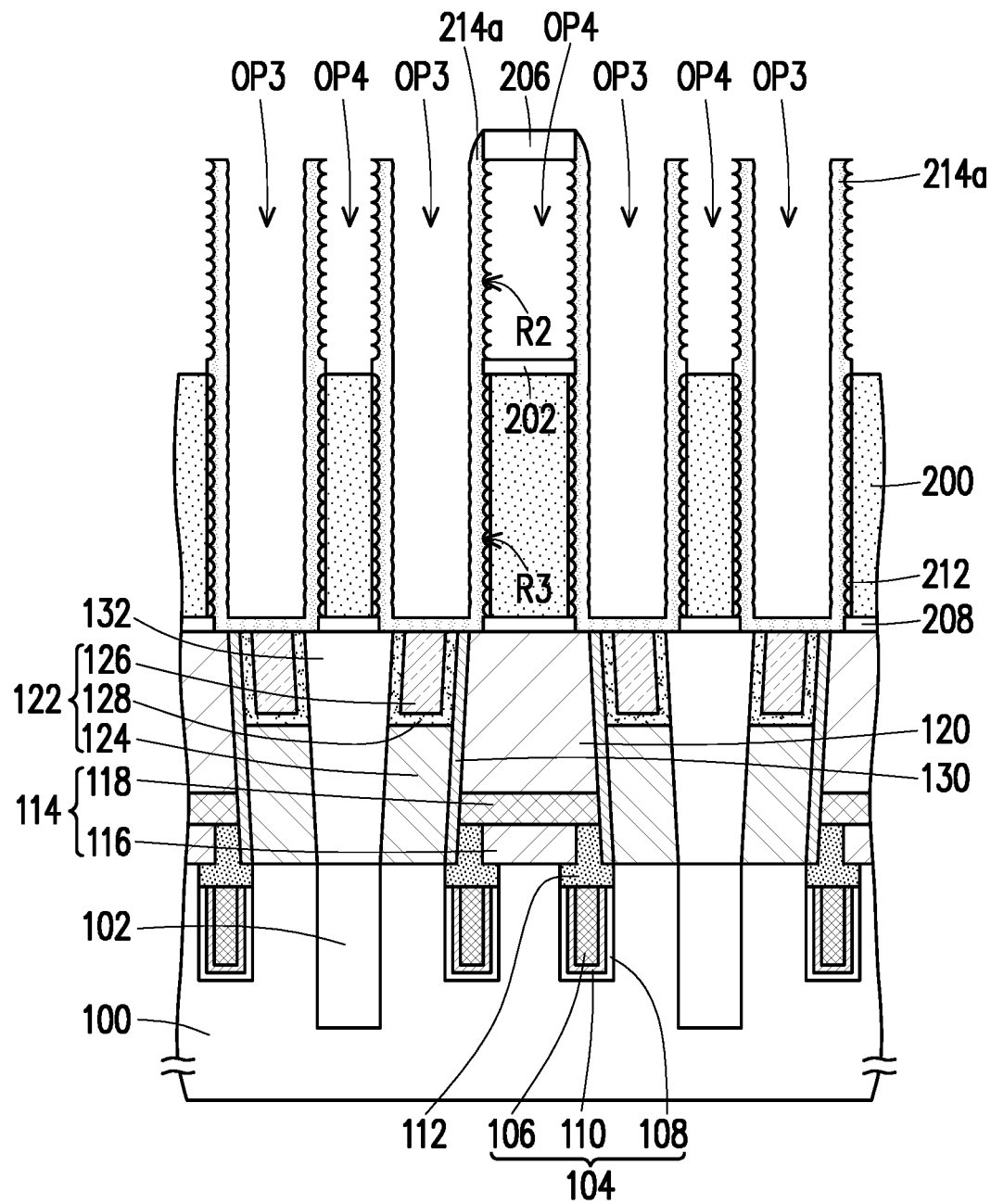

Referring to FIG. 2I, a part of the support layer 202 is removed to expose a part of the silicon material layer 200.

A method for removing the part of the support layer 202 is, for example, the dry etching method.

Figure 2J:
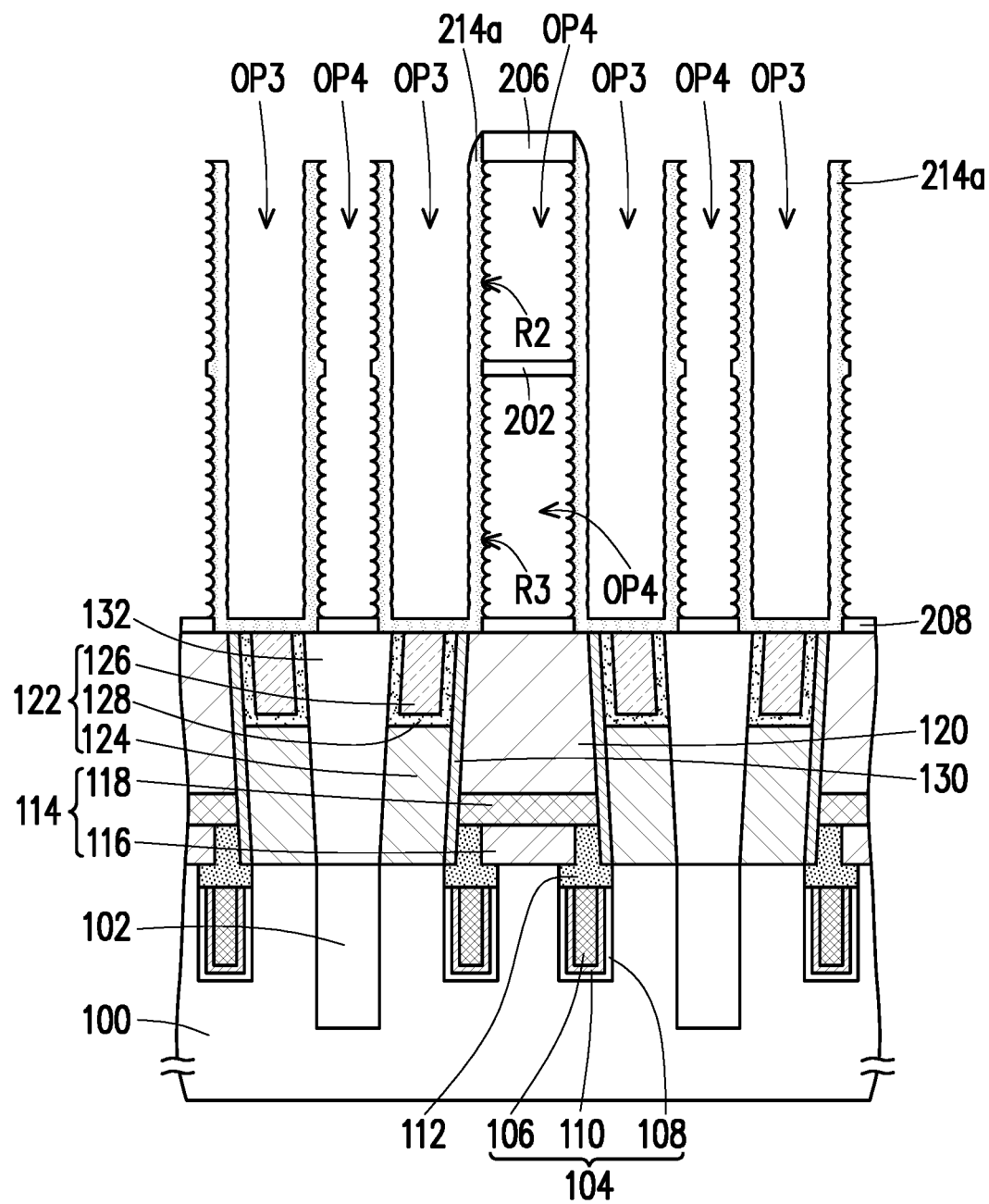

Referring to FIG. 2J, the silicon material layer 200 and the hemispherical grains 212 are removed. In this way, a range of the opening OP4 may be enlarged. The silicon material layer 200 and the hemispherical grains 212 may be removed by a wet etching process. An etchant used in the wet etching process for removing the silicon material layer 200 and the hemispherical grains 212 is, for example, nitric acid.

Figure 2K:
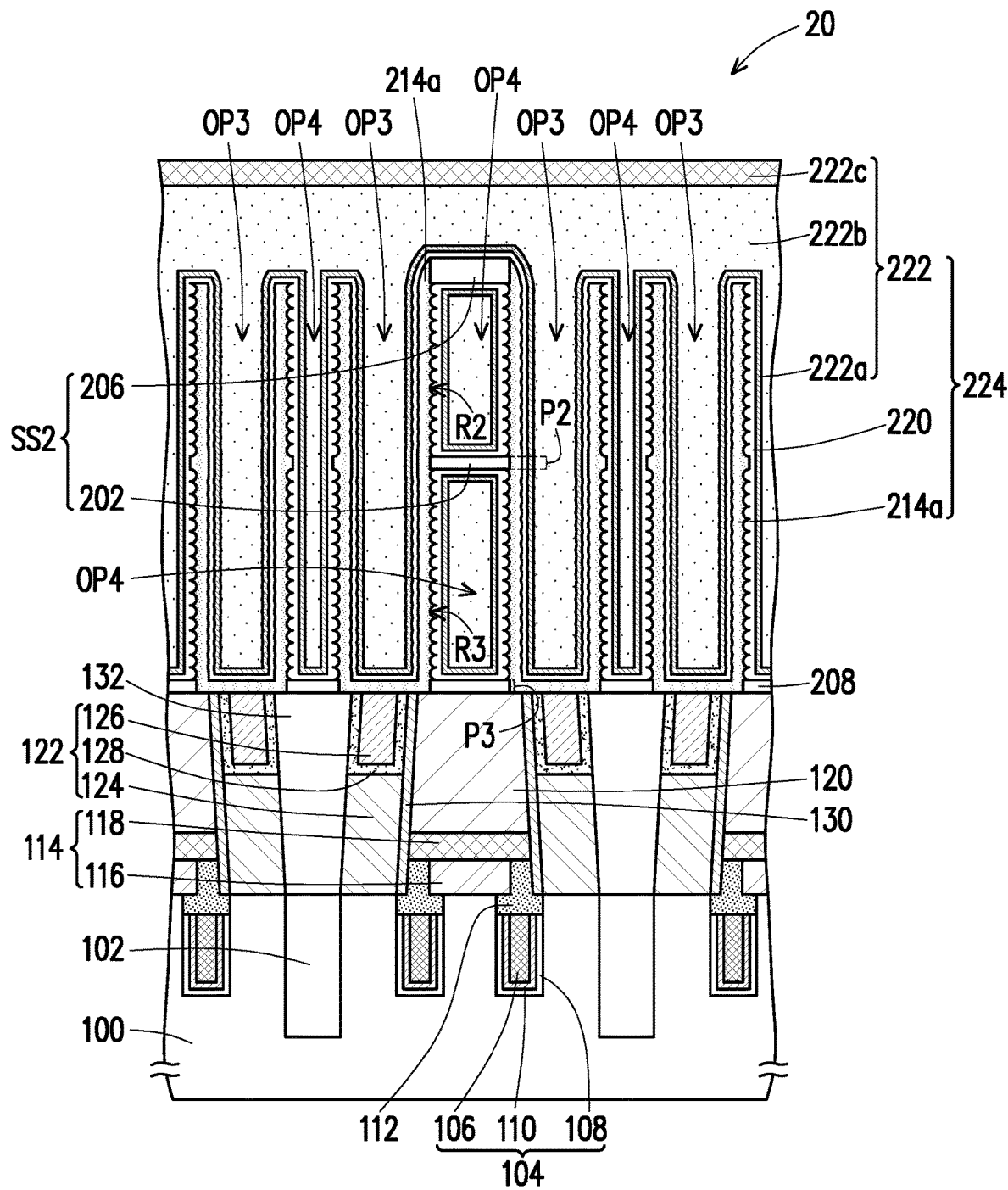

Referring to FIG. 2K, an insulating layer 220 may be formed on the electrode 214a. In some embodiments, the insulating layer 220 may be conformally formed on the electrode 214a. A material of the insulating layer 220 is, for example, a high-k material, such as tantalum pentoxide ($Ta_2O_5$) or zirconium oxide (ZrO). A method of forming the insulating layer 220 is, for example, the chemical vapor deposition method.

Then, an electrode 222 may be formed on the insulating layer 220. The electrode 222 fills the openings OP3 and the openings OP4. The electrode 222 may have a single-layer structure or a multi-layer structure. In the embodiment, the electrode 222 is, for example, a multi-layer structure. For example, the electrode 222 may include a conductor layer 222a and a conductor layer 222b. The conductor layer 222a is located on the insulating layer 220. A material of the conductor layer 222a is, for example, a metal compound (for example, titanium nitride) or a metal (for example, titanium or tantalum). A method of forming the conductor layer 222a is, for example, the chemical vapor deposition method. The conductor layer 222b is located on the conductor layer 222a. A material of the conductor layer 222b is, for example, a doped semiconductor material, such as boron-doped silicon germanium. A method of forming the conductor layer 222b is, for example, the chemical vapor deposition method. In addition, the electrode 222 may further include a conductor layer 222c. The conductor layer 222c is located on the conductor layer 222b. A material of the conductor layer 222c is, for example, metal, such as tungsten. A method of forming the conductor layer 222c is, for example, the physical vapor deposition method.

Based on the above method, a plurality of capacitors 224 may be formed on the substrate 100, but the disclosure is not limited thereto. As long as the number of the capacitors 224 is more than one, it falls within the scope of the disclosure. The capacitor 224 includes the electrode 214a, the electrode 222 and the insulating layer 220. In addition, based on the aforementioned method, a support structure SS2 connected between adjacent two of the electrodes 214a of adjacent two of the capacitors 224 may be formed. For example, the support structure SS2 may include the support layer 202 and the support layer 206.

Hereinafter, the semiconductor device 20 of the aforementioned embodiment is described with reference to FIG. 2K. In addition, although the aforementioned method is taken as an example to describe the method for forming the semiconductor device 20, the disclosure is not limited thereto.

Referring to FIG. 2K, the semiconductor device 20 includes the substrate 100 and the capacitor 224. In the embodiment, the semiconductor device 20 may include a plurality of the capacitors 224. The capacitor 224 may be a cylinder capacitor, but the disclosure is not limited thereto. The capacitor 224 includes the electrode 214a, the electrode 222 and the insulating layer 220. The electrode 214a is located on the substrate 100. The electrode 214a has a plurality of hemispherical recesses R2 and a plurality of hemispherical recesses R3. A shape of the electrode 214a is, for example, a cylindrical shape. A material of the electrode 214a is, for example, a metal compound (for example, titanium nitride) or metal (for example, titanium or tantalum). The electrode 222 is located on the electrode 214a. The insulating layer 220 is located between the electrode 214a and the electrode 222. Surfaces of the hemispherical recesses R2 are in direct contact with the insulating layer 220, and surfaces of the hemispherical recesses R3 are in direct contact with the insulating layer 220.

In addition, the semiconductor device 20 may further include the support structure SS2. The support structure SS2 is connected between adjacent two of the electrodes 214a of adjacent two of the capacitors 224. The support structure SS2 may be a single layer structure or a multi-layer structure. For example, the support structure SS2 may include the support layer 202 and the support layer 206. The support layer 202 may be connected between adjacent two of the electrodes 214a of adjacent two of the capacitors 224. The support layer 206 may be connected between adjacent two of the electrodes 214a of adjacent two of the capacitors 224. In some embodiments, the support layer 202 and the support layer 206 may be directly connected between adjacent two of the electrodes 214a of adjacent two of the capacitors 224. The support layer 202 may be located between the support layer 206 and the substrate 100. Moreover, the electrode 214a located between the support layer 202 and the support layer 206 may have the hemispherical recesses R2. The electrode 214a located between the substrate 100 and the support layer 202 may have the hemispherical recesses R3. In the embodiment, a portion P2 of the electrode 214a located between a top surface and a bottom surface of the support layer 202 does not have the hemispherical recess. In the embodiment, a portion P3 of the electrode 214a lower than the top surface of the stop layer 208 does not have the hemispherical recess. In the embodiment, two layers (i.e., the support layer 202 and the support layer 206) of the support structure SS2 are taken as an example for description, but the disclosure is not limited thereto. As long as the number of the support layers in the support structure SS2 is more than one, it falls within the scope of the disclosure.

In addition, description of the remaining components in the semiconductor device 20 may be obtained by referring to the description of the aforementioned embodiment. In addition, the materials, arrangement methods, forming methods and effects of the components in the semiconductor device 20 have been described in detail in the aforementioned embodiment, which are not repeated.

Based on the above embodiment, it is known that in the semiconductor device 20 and the manufacturing method thereof proposed in the disclosure, since the electrode 214a has the hemispherical recesses R2 and the hemispherical recesses R3, the surface area of the electrode 214a may be increased. In this way, a capacitance value of the capacitor 224 may be effectively increased, thereby improving an electrical performance of the semiconductor device 20 (for example, a DRAM).

In summary, in the semiconductor device and the manufacturing method thereof proposed in the disclosure, since the hemispherical recesses on the electrode may be used to increase the surface area of the electrode, a capacitance value of the capacitor and an electrical performance of the semiconductor device are effectively enhanced.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A method for manufacturing a semiconductor device, comprising:
   providing a substrate; and
   forming a capacitor on the substrate, wherein the capacitor comprises:
      a first electrode, located on the substrate, wherein the first electrode has a plurality of hemispherical recesses;
      a second electrode, located on the first electrode; and
      an insulating layer, located between the first electrode and the second electrode, wherein surfaces of the hemispherical recesses are in direct contact with the insulating layer, and
   the semiconductor device comprises a plurality of capacitors, and further comprises:
   a support structure, connected between adjacent two of the first electrodes of adjacent two of the capacitors, wherein the support structure comprises:
      a first support layer, connected between adjacent two of the first electrodes of adjacent two of the capacitors, wherein a bottom surface of the first electrode is lower than a bottom surface of the first support layer; and
      a second support layer, connected between adjacent two of the first electrodes of adjacent two of the capacitors, wherein the first support layer is located between the second support layer and the substrate.

2. The method for manufacturing the semiconductor device as claimed in claim 1, wherein
   the first electrode located between the first support layer and the second support layer has the hemispherical recesses, and
   the first electrode located between the substrate and the first support layer has the hemispherical recesses.

3. The method for manufacturing the semiconductor device as claimed in claim 1, wherein the first electrode located between the first support layer and the second support layer has the hemispherical recesses.

4. A semiconductor device, comprising:
   a substrate; and
   a capacitor, comprising:
      a first electrode, located on the substrate, wherein the first electrode has a plurality of hemispherical recesses;
      a second electrode, located on the first electrode; and
      an insulating layer, located between the first electrode and the second electrode, wherein surfaces of the hemispherical recesses are in direct contact with the insulating layer, and
   the semiconductor device comprises a plurality of capacitors, and further comprises:
   a support structure, connected between adjacent two of the first electrodes of adjacent two of the capacitors, wherein the support structure comprises:
      a first support layer, connected between adjacent two of the first electrodes of adjacent two of the capacitors, wherein a bottom surface of the first electrode is lower than a bottom surface of the first support layer; and
      a second support layer, connected between adjacent two of the first electrodes of adjacent two of the capacitors, wherein the first support layer is located between the second support layer and the substrate.

5. The semiconductor device as claimed in claim 4, wherein
   the first electrode located between the first support layer and the second support layer has the hemispherical recesses, and
   the first electrode located between the substrate and the first support layer has the hemispherical recesses.

6. The semiconductor device as claimed in claim 4, wherein the first electrode located between the first support layer and the second support layer has the hemispherical recesses.

7. The semiconductor device as claimed in claim 4, wherein a material of the first electrode comprises a metal compound or metal.

8. The semiconductor device as claimed in claim 4, wherein a shape of the first electrode comprises a cylindrical shape.

* * * * *